United States Patent
Tatemichi et al.

(10) Patent No.: US 8,143,595 B2
(45) Date of Patent: Mar. 27, 2012

(54) ION IMPLANTER

(75) Inventors: Junichi Tatemichi, Kyoto (JP); Masatoshi Onoda, Kyoto (JP); Kohichi Orihira, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 203 days.

(21) Appl. No.: 12/547,195

(22) Filed: Aug. 25, 2009

(65) Prior Publication Data
US 2010/0314552 A1 Dec. 16, 2010

(30) Foreign Application Priority Data
Jun. 11, 2009 (JP) .................. 2009-139924

(51) Int. Cl.
*C23C 14/50* (2006.01)
(52) U.S. Cl. ............ 250/453.11; 414/806; 250/492.21
(58) Field of Classification Search .... 250/491.1–492.3, 250/442.11, 453.11; 118/729–731, 630, 118/633, 723 CB; 414/806
See application file for complete search history.

(56) References Cited

U.S. PATENT DOCUMENTS

| | | | | |
|---|---|---|---|---|
| 4,633,138 A | * | 12/1986 | Tokiguchi et al. | 315/111.81 |
| 5,306,380 A | * | 4/1994 | Hiroki | 156/345.32 |
| 5,382,803 A | * | 1/1995 | Asakawa | 250/492.21 |
| 5,584,647 A | * | 12/1996 | Uehara et al. | 414/744.5 |
| 5,612,068 A | * | 3/1997 | Kempf et al. | 425/574 |
| 5,697,751 A | * | 12/1997 | Takahashi | 414/226.05 |
| 6,007,675 A | * | 12/1999 | Toshima | 156/345.32 |
| 6,092,485 A | * | 7/2000 | Ando et al. | 118/723 VE |
| 6,155,275 A | * | 12/2000 | Shinbara | 134/61 |
| 6,162,299 A | * | 12/2000 | Raaijmakers | 118/719 |
| 6,306,455 B1 | * | 10/2001 | Takamori et al. | 427/8 |
| 6,485,250 B2 | * | 11/2002 | Hofmeister | 414/744.1 |
| 6,555,825 B1 | * | 4/2003 | Mitchell et al. | 250/398 |
| 6,995,381 B2 | * | 2/2006 | Sheng et al. | 250/492.21 |
| 7,335,090 B2 | * | 2/2008 | Takahashi et al. | 451/41 |
| 7,362,493 B2 | * | 4/2008 | Huibers et al. | 359/291 |
| 7,367,139 B2 | * | 5/2008 | Ando et al. | 34/406 |
| 7,408,615 B2 | * | 8/2008 | Kuit et al. | 355/53 |
| 7,560,705 B2 | * | 7/2009 | Eiriksson et al. | 250/442.11 |
| 7,777,203 B2 | * | 8/2010 | Relleen et al. | 250/492.21 |
| 7,819,594 B2 | * | 10/2010 | Funakoshi et al. | 396/611 |
| 2001/0012483 A1 | * | 8/2001 | Kono et al. | 414/744.5 |
| 2001/0048867 A1 | * | 12/2001 | Lebar et al. | 414/217 |
| 2002/0020355 A1 | * | 2/2002 | Saeki et al. | 118/719 |
| 2002/0025375 A1 | * | 2/2002 | Takamori et al. | 427/240 |

(Continued)

FOREIGN PATENT DOCUMENTS

JP 9-129571 5/1997

*Primary Examiner* — Jack Berman
*Assistant Examiner* — Wyatt Stoffa
(74) *Attorney, Agent, or Firm* — Osha • Liang LLP

(57) ABSTRACT

An ion implanter includes an implantation chamber into which an ion beam is introduced, a holder for holding substrates on two columns of a first column and a second column in an X-direction, and a holder driving unit having a function of setting the holder in a horizontal state and then positioning the holder in a substrate exchange position and a function of setting the holder in a standing state and then driving reciprocally and linearly the holder along the X-direction in an irradiation area of the ion beam. Also, the ion implanter includes two load lock mechanisms, and two substrate carrying units equipped with arms, which carry the substrates between the load lock mechanisms and a substrate exchange position respectively, every two arms.

14 Claims, 16 Drawing Sheets

U.S. PATENT DOCUMENTS

| | | |
|---|---|---|
| 2002/0051644 A1* | 5/2002 | Sugimoto et al. ............. 396/564 |
| 2002/0089655 A1* | 7/2002 | Kida et al. ...................... 355/72 |
| 2003/0010292 A1* | 1/2003 | Kholodenko et al. ......... 118/728 |
| 2003/0136515 A1* | 7/2003 | Saeki et al. .............. 156/345.32 |
| 2004/0056213 A1* | 3/2004 | Evans ..................... 250/492.21 |
| 2004/0240971 A1* | 12/2004 | Tezuka et al. ................. 414/217 |
| 2005/0166849 A1* | 8/2005 | Weeks et al. ................. 118/730 |
| 2005/0251279 A1* | 11/2005 | Ray ............................... 700/114 |
| 2005/0263078 A1* | 12/2005 | Lindenberg et al. .......... 118/730 |
| 2005/0280788 A1* | 12/2005 | Kuit et al. ...................... 355/53 |
| 2007/0002303 A1* | 1/2007 | Van De Moosdijk et al. .. 355/72 |
| 2007/0045231 A1* | 3/2007 | Wada .............................. 216/83 |
| 2007/0115013 A1* | 5/2007 | Andrews et al. .............. 324/755 |
| 2007/0158583 A1* | 7/2007 | Cho ........................ 250/440.11 |
| 2007/0184596 A1* | 8/2007 | Ando .......................... 438/172 |
| 2007/0210261 A1* | 9/2007 | Kato ....................... 250/453.11 |
| 2008/0086237 A1* | 4/2008 | Rebstock ...................... 700/248 |
| 2008/0105836 A1* | 5/2008 | Eiriksson et al. .......... 250/522.1 |
| 2009/0041980 A1* | 2/2009 | Miyashita et al. ............. 428/138 |
| 2009/0224151 A1* | 9/2009 | Hatakeyama et al. ........ 250/307 |
| 2009/0263230 A1* | 10/2009 | Hwang ......................... 414/806 |

* cited by examiner

ION IMPLANTER

TECHNICAL FIELD

The present disclosure relates to an ion implanter for performing an ion implantation by irradiating an ion beam onto a substrate (e.g., a semiconductor substrate).

RELATED ART

In the related art, the so-called batch type ion implanter for performing an ion implantation collectively onto a plurality of substrates on a rotary disc by irradiating an ion beam, whose width is expanded by using a scanning, onto a location on the rotary disc, while rotating the rotary disc on which the plurality of substrates are held has been proposed (see Patent Literature 1, for example).

[Patent Literature 1] JP-A-9-129571 (Paragraph 0020, FIG. 3)

In the ion implanter in the related art, such a problem existed that uniformity of an ion implantation amount (dose) distribution in a plane of a substrate is not good.

This problem will be explained with reference to FIG. 17 hereunder. Each substrate 94 is disposed on a rotary disc 92. The rotary disc 92 is rotated at a constant angular velocity $\omega$ around a center of rotation 93 in an arrow U direction.

On an inner side and an outer side in the plane of the substrate 94 (a side closer to the center of rotation 93 of the rotary disc 92 in the plane of the substrate 94 is the inner side and an opposing side is the outer side), a relative velocity v to an ion beam 90 is different in proportion to a radius r. Concretely, this velocity v is expressed by $v=r\omega$.

Since a beam current density distribution of the ion beam 90 is substantially uniform, an ion implantation amount into the substrate 94 is in inverse proportion to the velocity v. Therefore, such a nonuniform implantation amount distribution is produced on the substrate 94 that an implantation amount in a region $R_{IN}$ that is located closer to the inner side is larger than that in a region $R_{OUT}$ that is located closer to the outer side. In addition, this nonuniform implantation amount distribution is caused by a rotational motion of the rotary disc 92, and thus this nonuniform implantation amount distribution assumes a circular arc shape around the center of rotation 93. A typical example of this nonuniform implantation amount distribution is represented by contour lines 96.

There is such a consideration that the above nonuniform implantation amount distribution should be corrected and uniformized by adjusting the beam current density distribution of the ion beam 90, for example. In this case, it is not easy to correct such complicated implantation amount distribution.

When the uniformity of the implantation amount distribution in the plane of the substrate is not good, portions of the substrate into which the ion has been implanted and which can be used effectively are reduced, and thus yield is lowered. As more concrete example, in a situation that the ion implantation is employed as one of steps that are applied to form a large number of semiconductor devices in the plane of the semiconductor substrate 94, unless the uniformity of the implantation amount distribution is good, a variation in the characteristics of the semiconductor device is increased. As a result, yield of the manufacture of the semiconductor device is lowered.

SUMMARY

Exemplary embodiments of the present invention provide an ion implanter capable of performing collectively an ion implantation onto a plurality of substrates, and also capable of improving a uniformity of an implantation amount distribution in a plane of each of the substrates.

An ion implanter according to an exemplary embodiment of the invention, comprises:

an implantation chamber, which is exhausted to vacuum and into which an ion beam is introduced;

a holder provided in the implantation chamber, the holder holding substrates, to which an ion implantation is performed by irradiating the ion beam, on two columns of a first column and a second column in an X-direction;

a holder driving unit, which sets the holder in a horizontal state and then positions the holder in a substrate exchange position, and which sets the holder in a standing state and then drives reciprocally and linearly the holder along the X-direction in an irradiation area of the ion beam;

first and second load lock mechanisms, which transfer the substrates between an atmosphere side and the implantation chamber;

a first substrate carrying unit having a first arm and a second arm that are positioned mutually vertically and are reciprocally rotated mutually independently around a same center line, wherein the first arm carries the substrates from the first load lock mechanism to the first column of the holder in the substrate exchange position, and the second arm carries the substrates from the first column of the holder in the substrate exchange position to the first load lock mechanism; and a second substrate carrying unit having a third arm and a fourth arm that are positioned mutually vertically and are reciprocally rotated mutually independently around a same center line, wherein the third arm carries the substrates from the second load lock mechanism to the second column of the holder in the substrate exchange position and the fourth arm carries the substrates from the second column of the holder in the substrate exchange position to the second load lock mechanism.

According to this ion implanter, the holder that holds the substrates on two columns are driven reciprocally and linearly in the irradiation area of the ion beam by the holder driving unit. Therefore, the ion implantation can be performed collectively to plural substrates.

Also, the holder and the substrates are driven reciprocally and linearly. Therefore, unlike the case where the rotary disc is employed, a relative velocity between the substrate and the ion beam in the plane of each substrate becomes even (uniform). As a result, the uniformity of the implantation amount distribution in the plane of each substrate can be improved.

An ion implanter according to an exemplary embodiment of the invention, comprises:

an implantation chamber, which is exhausted to vacuum and into which an ion beam is introduced;

a holder provided in the implantation chamber, the holder holding substrates, to which an ion implantation is performed by irradiating the ion beam, on two columns of a first column and a second column in an X-direction;

a holder driving unit, which sets the holder in a horizontal state and then positions the holder in a substrate exchange position, and which sets the holder in a standing state and then drives reciprocally and linearly the holder in a direction intersecting with the X-direction in an irradiation area of the ion beam;

first and second load lock mechanisms, which transfer the substrates between an atmosphere side and the implantation chamber;

a first substrate carrying unit having a first arm and a second arm that are positioned mutually vertically and are reciprocally rotated mutually independently around a same center line, wherein the first arm carries the substrates from the first load lock mechanism to the first column of the holder in the substrate exchange position, and the second arm carries the substrates from the first column of the holder in the substrate exchange position to the first load lock mechanism; and a second substrate carrying unit having a third arm and a fourth arm that are positioned mutually vertically and are reciprocally rotated mutually independently around a same center line, wherein the third arm carries the substrates from the second load lock mechanism to the second column of the holder in the substrate exchange position and the fourth arm carries the substrates from the second column of the holder in the substrate exchange position to the second load lock mechanism, wherein the ion beam irradiated onto the substrates has a dimension that covers the substrates being held on two columns by the holder with a scanning of the ion beam or without the scanning.

According to this ion implanter, the holder that holds the substrates on two columns are driven reciprocally and linearly in the irradiation area of the ion beam by the holder driving unit. Therefore, the ion implantation can be performed collectively to plural substrates.

Also, the holder and the substrates are driven reciprocally and linearly. Therefore, unlike the case where the rotary disc is employed, a relative velocity between the substrate and the ion beam in the plane of each substrate becomes even (uniform). As a result, the uniformity of the implantation amount distribution in the plane of each substrate can be improved.

The holder may be constructed to hold plural substrates in plural rows on the first column and the second column respectively, and the first and second substrate carrying units and the first and second load lock mechanisms may be provided to correspond to this holder.

Further, the intervening unit having the function of intervening the transfer of the substrate between the holder positioned in the substrate exchange position and the first to fourth arms may be provided.

As the substrate, the rectangular substrate or the circular substrate may be employed.

The holder may have a plurality of electrostatic chucks that attract and hold the substrate by means of static electricity respectively, have a rectangular planar shape respectively, and are fixed to direct in the direction that corresponds to the twist angle of the substrate.

According to this ion implanter, the holder that holds the substrates on two columns are driven reciprocally and linearly in the irradiation area of the ion beam by the holder driving unit. Therefore, the ion implantation can be performed collectively to plural substrates.

Also, the holder and the substrates are driven reciprocally and linearly. Therefore, unlike the case where the rotary disc is employed, a relative velocity between the substrate and the ion beam in the plane of each substrate becomes even (uniform). As a result, the uniformity of the implantation amount distribution in the plane of each substrate can be improved.

Also, the first and second load lock mechanisms and the first and second substrate carrying units equipped with two arms respectively are provided. Therefore, the transfer of the substrates between the atmosphere side and the implantation chamber and the carry of the substrates between respective load lock mechanisms and the holder can be carried out smoothly. As a result, a throughput can be improved.

According to the invention, the holder is constructed such that plural substrates can be held in plural rows on the first column and the second column respectively, and also the first and second substrate carrying units and the first and second load lock mechanisms are constructed to correspond to such configuration. Therefore, the ion implantation can be performed collectively to the larger number of substrates, and plural substrates corresponding to the plural rows can be handled collectively in the first and second substrate carrying units and the first and second load lock mechanisms. As a result, a throughput can be improved.

According to the invention, the intervening unit having a function of intervening the transfer of the substrates between the holder positioned in the substrate exchange position and the first to fourth arms is provided. Therefore, the transfer of the substrates between the holder and the first to fourth arms can be carried out more smoothly. As a result, a throughput can be improved.

According to the invention, the intervening unit having a function of intervening the transfer of the substrates between the holder positioned in the substrate exchange position and the first to fourth arms and a function of setting collectively the twist angle of respective substrates, which are to be held by the holder, to a predetermined angle is provided. Therefore, the transfer of the substrates between the holder and the first to fourth arms can be carried out more smoothly. As a result, a throughput can be improved. In addition, the twist angle of respective rectangular substrates that are to be held by the holder can be set collectively to a predetermined angle.

According to the invention, the holder has a plurality of electrostatic chucks that have a rectangular planar shape respectively and are fixed toward the direction that corresponds to the twist angle of respective substrates. Therefore, when the ion implantation is performed while holding respective substrates being twisted by the twist angle by using the electrostatic chucks, such an event can be prevented that the ion beam hits the electrostatic chucks and the electrostatic chucks are damaged. In addition, an attracting force applied to the substrate can be increased since a contact area between the electrostatic chuck and the substrate can be increased, and also the substrate can be cooled effectively since a heat transfer area between the substrate and the electrostatic chuck can be increased.

Other features and advantages may be apparent from the following detailed description, the accompanying drawings and the claims.

DETAILED DESCRIPTION

Figure 1:
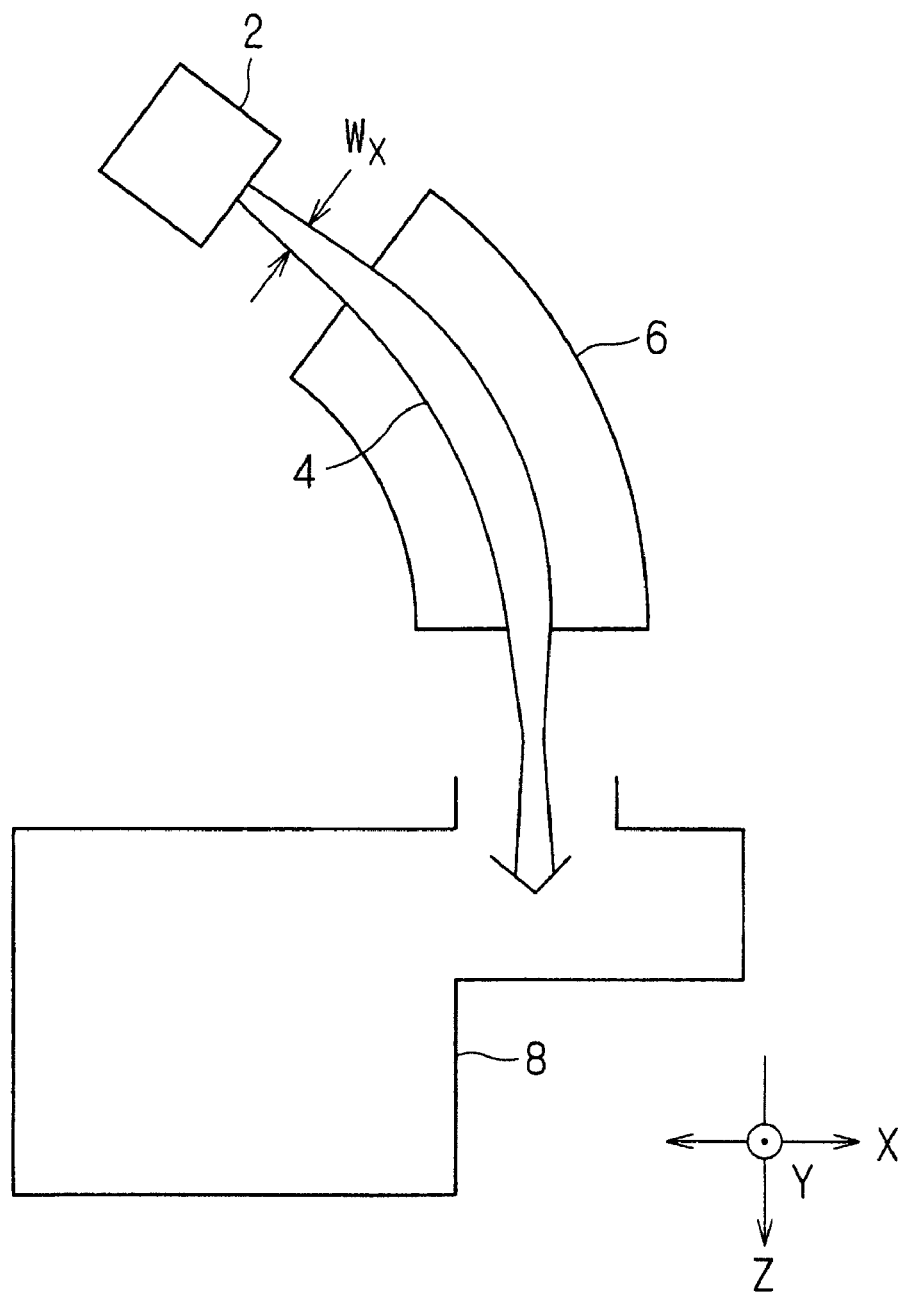
FIG. 1 is a schematic plan view showing an embodiment of an ion implanter according to this invention.
Figure 2:
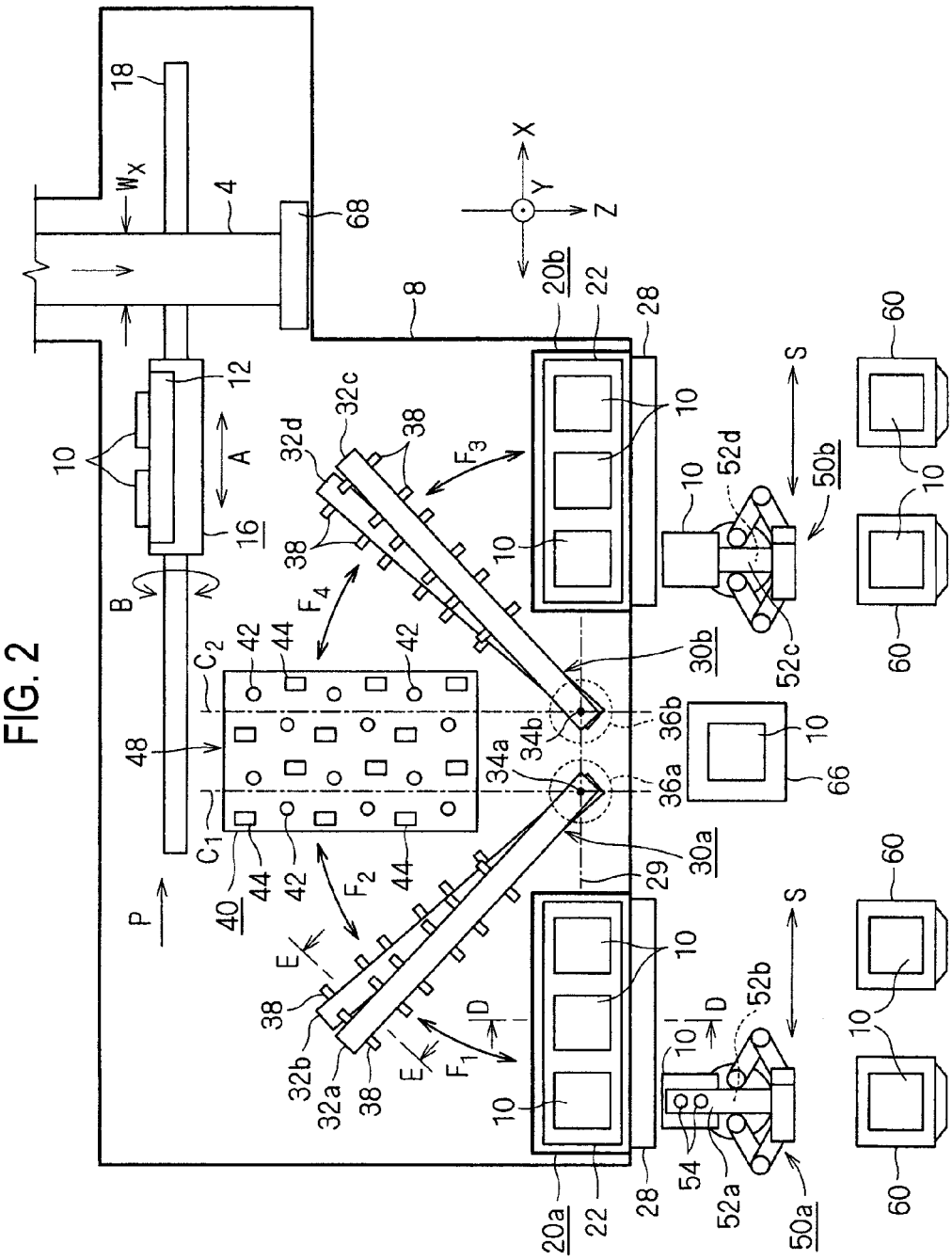
FIG. 2 is a plan view showing surroundings of an implantation chamber of the ion implanter in FIG. 1 in an enlarged manner.

FIG. 1 is a schematic plan view showing an embodiment of an ion implanter according to this invention. FIG. 2 is a plan view showing surroundings of an implantation chamber of the ion implanter in FIG. 1 in an enlarged manner.

This ion implanter is constructed such that a momentum analysis (e.g., mass separation) is applied to an ion beam 4, which is extracted from an ion source 2, by a separation electromagnet 6 and then the ion beam 4 is introduced into an implantation chamber 8. A path of the ion beam 4 from the ion source 2 to the implantation chamber 8 is kept in a vacuum atmosphere.

In this case, this ion implanter may be constructed such that the separation electromagnet 6 is not provided to not apply the mass separation and the ion beam 4 that is extracted from the ion source 2 is introduced into the implantation chamber 8. The ion implanter in this case is called a mass non-separation type ion implanter.

Here, assume that the traveling direction of the ion beam 4 is set to the Z-direction, and two direction that intersect substantially with each other in planes that are intersected substantially with this Z-direction respectively are set to the X-direction (e.g., the horizontal direction) and the Y-direction (e.g., the vertical direction) respectively. This embodiment is constructed such that the ion beam 4 having a shape whose dimension $W_Y$ (see FIG. 3) in the Y-direction is larger than a dimension $W_X$ in the X-direction (this is also called like a ribbon) is extracted from the ion source 2, and the ion beam 4 having the above shape is introduced into the implantation chamber 8 not to undergo the scanning of the ion beam 4.

In this event, this ion implanter may be constructed such that the ion beam 4 having a dimension that is smaller than that introduced into the implantation chamber 8 is extracted from the ion source 2, and then this ion beam 4 is scanned by a scanner located in the beam path between the ion source and the implantation chamber, for example, and is introduced into the implantation chamber 8.

By reference to FIG. 2, the implantation chamber 8 is exhausted to a predetermined degree of vacuum by a vacuum exhausting apparatus (not shown). Also, the ion beam 4 is introduced into the implantation chamber 8.

A holder 12 is provided in the implantation chamber 8. This holder 12 holds substrates 10, onto which the ion implantation is performed by irradiating the ion beam 4, in two columns of a first column $C_1$ and a second column $C_2$ in a predetermined direction, concretely, the X-direction in this embodiment.

In FIG. 2, FIG. 1 to FIG. 14, FIG. 16, and the like, the holder 12 is illustrated in a simplified manner. An example of a more concrete structure of the holder 12 is shown in FIG. 4 and FIG. 5.

Figure 4:
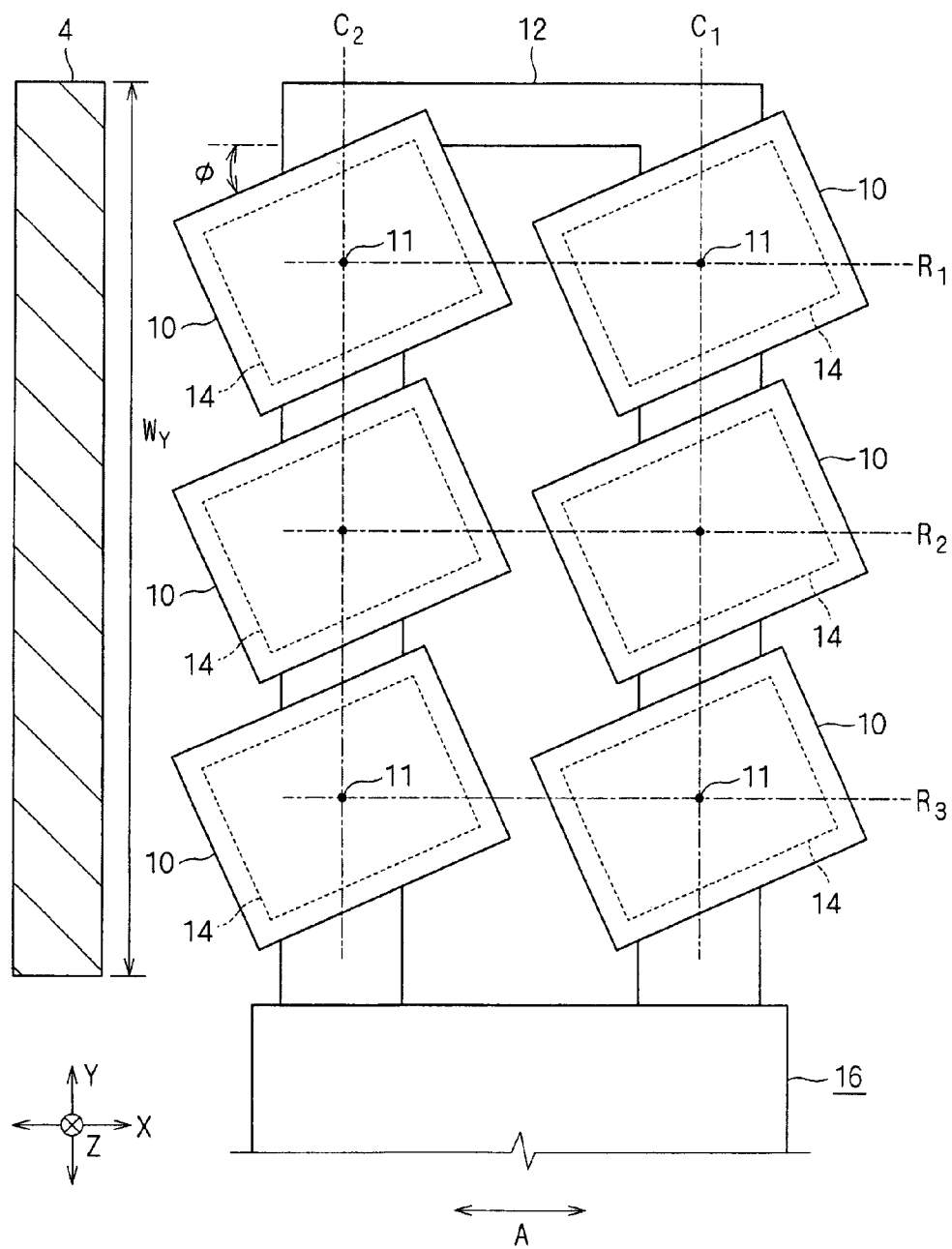
FIG. 4 is a front view showing an example of the holder that holds a substrate in a standing state, when viewed in a traveling direction Z of an ion beam.
Figure 5:
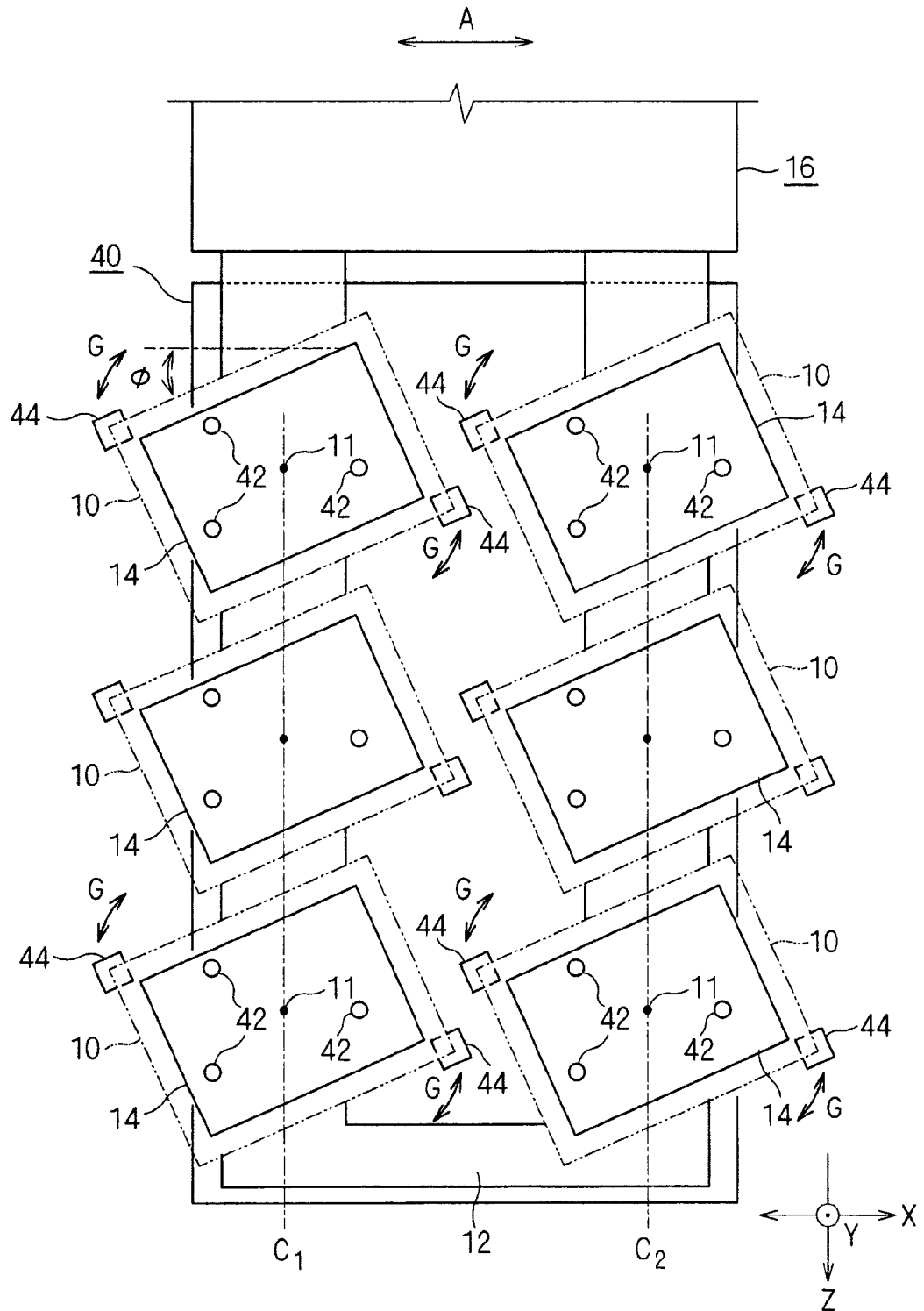
FIG. 5 is a plan view showing an example of the holder and an intervening unit being kept in a horizontal state, when viewed from the substrate carrying unit side.

In this embodiment, as shown in FIG. 4 and FIG. 5, the holder 12 has a square frame body. With this arrangement, it is made easy that interference between the holder 12 and lifting pins 42 and twist guides 44, described later, should be avoided. Also, a weight reduction of the holder 12 can be attained.

The holder 12 may be formed to hold the substrate 10 in one of the rows formed by the first column $C_1$ and the second column $C_2$. Like this embodiment, the holder 12 may be formed to hold plural substrates 10 in a plurality of rows $R_1$ to $R_3$ formed by the first column $C_1$ and the second column $C_2$ respectively (see FIG. 4 and FIG. 5, for example). The number of plural rows is three in this embodiment, but such number is not limited to this.

Each substrate 10 is formed of a semiconductor substrate, for example, but the substrate is not limited to this. Also, a planar shape of the substrate may be set to a rectangle, or may be set to a circle, or the like. In the following, explanation will be made by taking the case of a rectangle as an example. Also, the similar situation will be given in the drawings.

Figure 3:
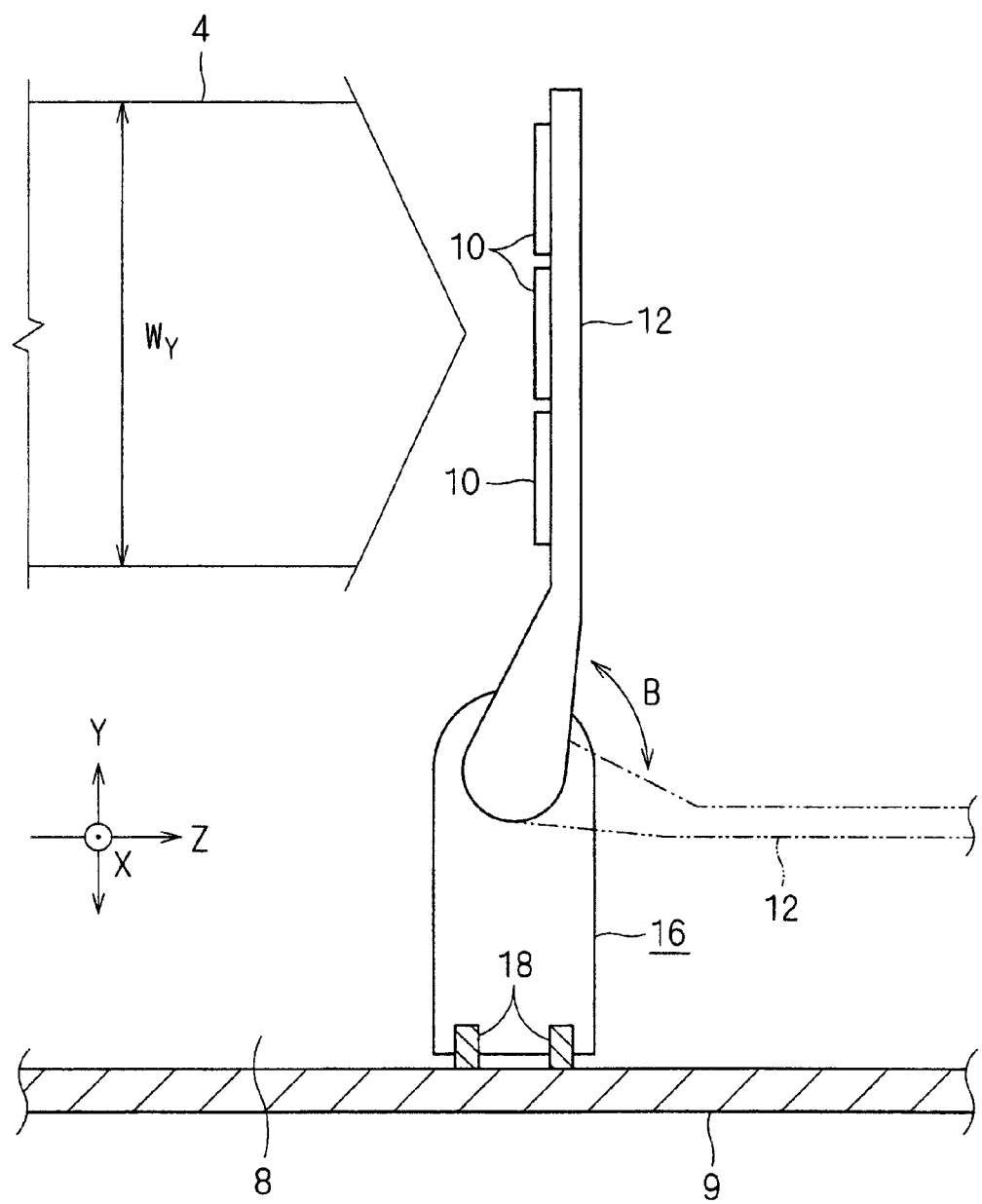
FIG. 3 is a side view showing a holder driving unit in FIG. 2 in an enlarged manner when viewed in an arrow P direction.

In both cases where the ion beam 4 when irradiated onto the substrate 10 does not undergo the scanning and where the ion beam 4 undergoes the scanning, such ion beam 4 has the dimension $W_Y$ in the Y-direction to cover the rows (one row or plural rows) the substrates 10 held on the holder 12 (see FIG. 3 and FIG. 4, for example).

By reference to FIG. 2 and FIG. 3, this ion implanter is equipped with a holder driving unit 16 that drives the holder 12. The holder driving unit 16 has a function of setting the holder 12 in a horizontal state (containing a substantial horizontal state. See a chain double-dashed line in FIG. 3) by turning the holder 12, as indicated with an arrow B, and then positioning the holder 12 in a predetermined substrate exchange position 48 in the implantation chamber 8. The holder driving unit 16 has also a function of driving reciprocally and linearly the holder 12 and the substrates 10 being held on the holder 12 in an irradiation area of the ion beam 4 in the X-direction, by setting the holder 12 in a standing state (not to limited to a vertical state. For example, see a solid line in FIG. 3) and then driving reciprocally and linearly the holder 12 along the X-direction, as indicated with an arrow A. In this embodiment, an intervening unit 40 is provided in the substrate exchange position 48, but this intervening unit 40 will be described later.

Because of the reciprocal and linear driving and the dimension $W_Y$ of the ion beam 4 in the Y-direction as described above, the ion implantation can be performed collectively to plural substrates 10 being held on the holder 12.

In this embodiment, most of the constituent elements of the holder driving unit 16 are provided in the implantation chamber 8. The reciprocal and linear motion of the holder driving unit 16 is guided by rails 18 provided on a bottom face 9 of the implantation chamber 8.

This ion implanter is equipped with a first load lock mechanism 20a and a second load lock mechanism 20b used to carry the substrate 10 between the interior of the implantation chamber 8 and the exterior side of the implantation chamber 8. In this embodiment, both load lock mechanisms 20a, 20b are arranged mutually at a distance in the X-direction. More concretely, both load lock mechanisms 20a, 20b are arranged in substantially bilaterally symmetrical positions to a center line of the substrate exchange position 48 in the X-direction.

Respective load lock mechanisms 20a, 20b (more concretely, a load lock chamber 21 constituting them, described later) are exhausted mutually independently to a predetermined degree of vacuum by a vacuum exhausting apparatus (not shown). Also, a vent gas such as a cleaning gas, a nitrogen gas, or the like is introduced into the load lock chamber 21, and the load lock mechanisms 20a, 20b are restored to an atmospheric state (this is called a "vent" hereunder).

A more concrete example of the structure of both load lock mechanisms 20a, 20b will be explained with reference to FIG. 6 later.

This ion implanter is equipped with a first substrate carrying unit 30a and a second substrate carrying unit 30b.

The first substrate carrying unit 30a has a first arm 32a and a second arm 32b that are positioned mutually vertically, and can be reciprocally rotated mutually independently around a same center line 34a, as indicated with arrows $F_1$, $F_2$, respectively. The first arm 32a carries the substrate 10 from the first load lock mechanism 20a to the first column $C_1$ of the holder 12 in the substrate exchange position 48, and also the second arm 32b carries the substrate 10 from the first column $C_1$ of the holder 12 in the substrate exchange position 48 to the first load lock mechanism 20a.

The second substrate carrying unit 30b has a third arm 32c and a fourth arm 32d that are positioned mutually vertically, and can be reciprocally rotated mutually independently around a same center line 34b, as indicated with arrows $F_3$, $F_4$, respectively. The third arm 32c carries the substrate 10 from the second load lock mechanism 20b to the second column $C_2$ of the holder 12 in the substrate exchange position 48, and also the fourth arm 32d carries the substrate 10 from the second column $C_2$ of the holder 12 in the substrate exchange position 48 to the second load lock mechanism 20b.

In this embodiment, respective arms 32a to 32d are formed like a straight rod respectively.

In this embodiment, the center line 34a passes through an intersection point between a line 29, which connects the center points of both load lock mechanisms 20a, 20b in the X-direction, and a center line of the first column $C_1$ of the holder 12 in the substrate exchange position 48 in the Y-direction. In this embodiment, the center line 34b passes through an intersection point between the line 29 and a center line of the second column $C_2$ of the holder 12 in the substrate exchange position 48 in the X-direction.

The substrate carrying units 30a, 30b have driving units 36a, 36b, which rotated the arms 32a to 32d respectively as described above, respectively. Most of the constituent elements of both driving units 36a, 36b are provided out of the bottom surface of the implantation chamber 8.

In this embodiment, both arms 32a, 32b of the first substrate carrying unit 30a can carry plural (in this embodiment, three) of substrates being held in positions corresponding to plural rows of the first column $C_1$ of the holder 12 respectively. Similarly, both arms 32c, 32d of the second substrate carrying unit 30b can carry plural (in this embodiment, three) of substrates being held in positions corresponding to plural rows of the second column $C_2$ of the holder 12 respectively. In this case, when the holder 12 holds merely the substrates 10 in one row, the arms 32a to 32d may be of the type that holds one substrate 10, respectively.

Figure 7:
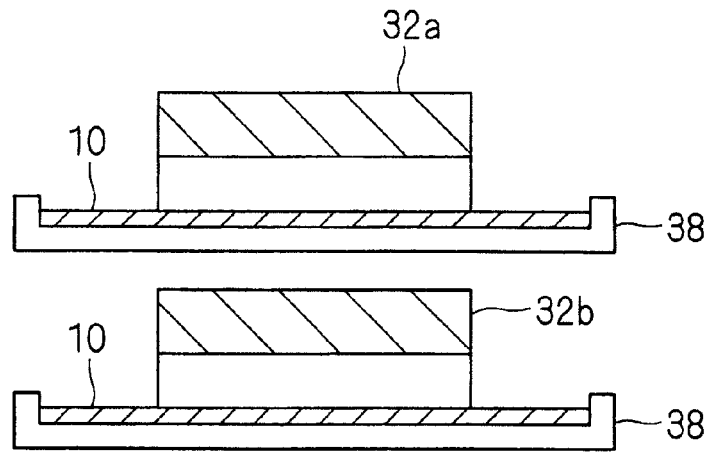
FIG. 7 is an enlarged sectional view taken along a line E-E in FIG. 2.

Like an example shown in FIG. 2 and FIG. 7, respective arms 32a to 32d have respective supporting members 38 that support the substrate 10 under respective arms 32a to 32d. The supporting member 38 supports an end portion of the substrate 10 from the lower side.

The first load lock mechanism 20a and the second load lock mechanism 20b have the same structure mutually. Therefore, the structure, etc. of the first load lock mechanism 20a will be explained by way of example herein. Similarly the following explanation is applicable to the second load lock mechanism 20b.

Figure 6:
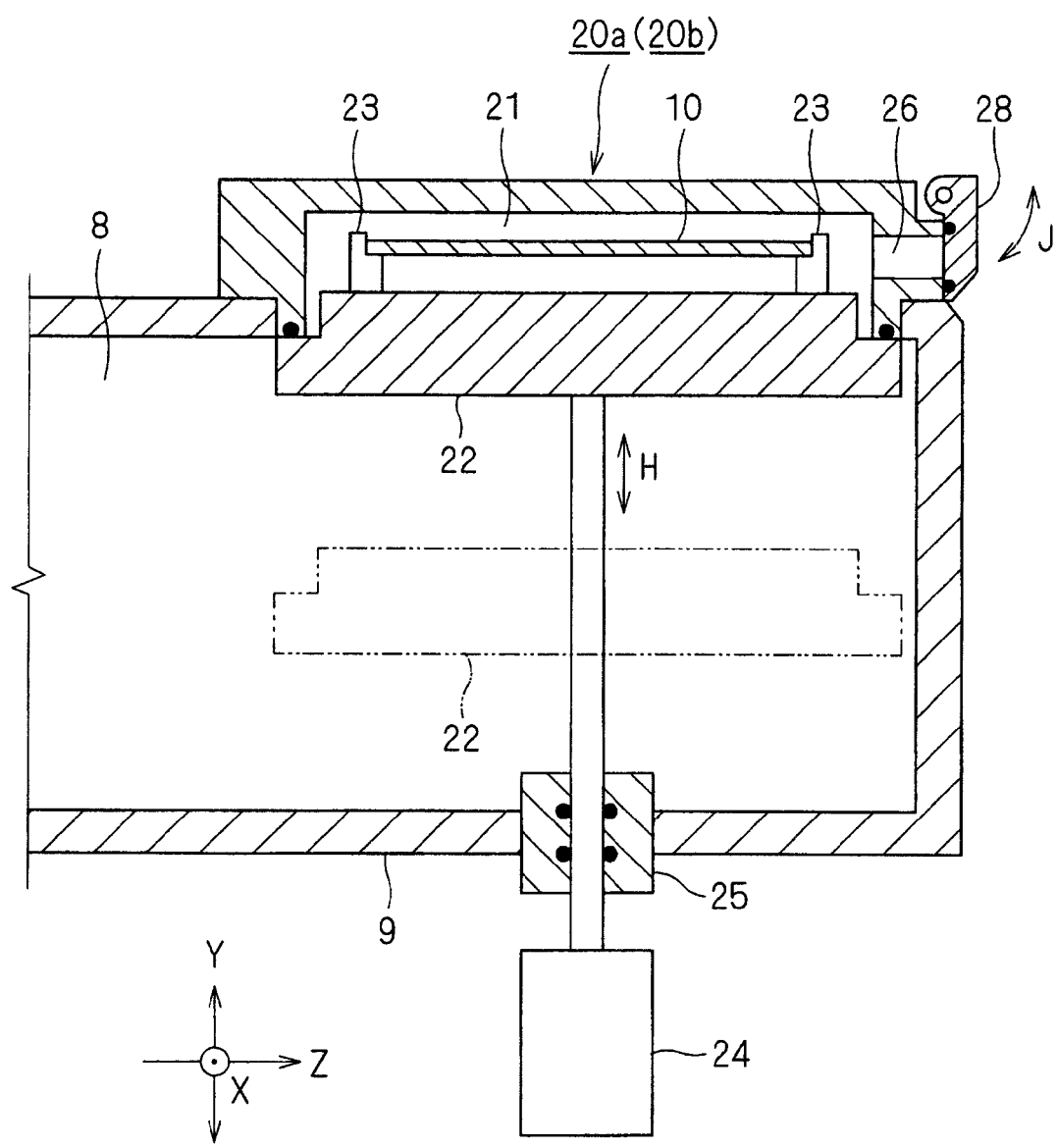
FIG. 6 is an enlarged sectional view taken along a line D-D in FIG. 2.

Like an example shown in FIG. 6, the first load lock mechanism 20a has the load lock chamber (this is also called a vacuum preliminary chamber) 21. It is possible to say that the load lock chamber 21 is provided adjacent to a top portion of the implantation chamber 8. An access port 26 through which arms 52a, 52b of a first substrate carrying unit 50a, on which the substrate 10 is put on and which are located on the atmosphere side described later, go out and come in is provided between the load lock chamber 21 and the atmosphere side. The access port 26 is opened/closed by a vacuum valve (e.g., a flap valve) 28 that is opened/closed as indicated with an arrow J.

The load lock chamber 21 and the implantation chamber 8 is partitioned by a valve body 22 that is caused by an elevating unit 24 to move up and down via a vacuum sealing portion 25, as indicated with an arrow H. That is, this valve body 22 acts as a vacuum valve and supports the substrate 10. A supporting member 23 for supporting the substrate 10 in a slightly lifted state is provided over the valve body 22. The supporting member 23 supports the end portion of the substrate 10 from the bottom. Accordingly, the substrate 10 is transferred in the position where the valve body 22 is lifted up (see a solid line in FIG. 6) by the arms 52a, 52b of the first substrate carrying unit 50a located on the atmosphere side, and also the substrate 10 is transferred in the position where the valve body 22 is moved down (see a chain double-dashed line in FIG. 6) by the arms 32a, 32b of the first substrate carrying unit 30a on the vacuum side.

More particularly, when the valve body 22 is lifted up to the position indicated with a solid line, the load lock chamber 21 and the implantation chamber 8 can be partitioned by the valve body 22. In this state, the interior of the load lock chamber 21 can exhausted to a vacuum by the vacuum exhausting apparatus (not shown) or can be restored to the atmospheric pressure state (i.e., ventilated). When the vacuum valve 28 is opened in the atmospheric pressure state, the substrate 10 can be carried (put in and taken out) between the valve body 22 and the atmosphere side by the arm 52a, 52b of the first substrate carrying unit 50a on the atmosphere side. When the valve body 22 is moved down to the position indicated with a chain double-dashed line, the substrate 10 can be carried between the valve body 22 and the implantation chamber 8 by the arms 32a, 32b of the first substrate carrying unit 30a on the vacuum side.

By reference to FIG. 2, in this embodiment, the first load lock mechanism 20a can hold plural (in this embodiment, three) of substrates 10 in respective positions corresponding to plural substrates 10 that are held by the first or second arm 32a, 32b of the first substrate carrying unit 30a. Similarly, the second load lock mechanism 20b can hold plural (in this embodiment, three) of substrates 10 in respective positions corresponding to plural substrates 10 that are held by the third or fourth arm 32c, 32d of the second substrate carrying unit 30b. In this event, when the holder 12 holds the substrate 10 merely in one row and the arms 32a to 32d hold one substrate 10 respectively, both load lock mechanisms 20a, 20b may be of the type that can hold one substrate 10, respectively.

The transfer of the substrate 10 between the holder 12 located in the substrate exchange position 48 and respective arms 32a to 32d may be achieved directly without intervention of the intervening unit 40 described later. Alternatively, such transfer of the substrate 10 may be achieved via the intervening unit 40 like this embodiment. When the intervening unit 40 is interposed, the transfer of the substrate 10 between the holder 12 and the first to fourth arms 32a to 32d can be achieved more smoothly. Therefore, a throughput can be improved much more.

In this embodiment, the ion implanter includes the intervening unit 40 which is provided in the substrate exchange position 48, has a plurality of supporting members provided to each substrate 10 respectively to support each substrate 10 respectively and an elevating unit for elevating collectively the concerned supporting members, has a function of intervening the transfer of the substrate 10 between the holder 12 in the substrate exchange position 48 and the first to fourth arms 32a to 32d. In a concrete example described hereunder, the lifting pins 42 and/or the twist guides 44 correspond to the supporting members, and a lifting pin elevating unit 70 and/or a twist guide elevating unit 88 corresponds to the elevating unit.

Then, a more concrete example of the intervening unit 40 will be explained hereunder. In this embodiment, the intervening unit 40 shown in FIG. 2, FIG. 5, and the like is prepared for the rectangular substrate 10, and has a structure descried as follows.

Figure 8:
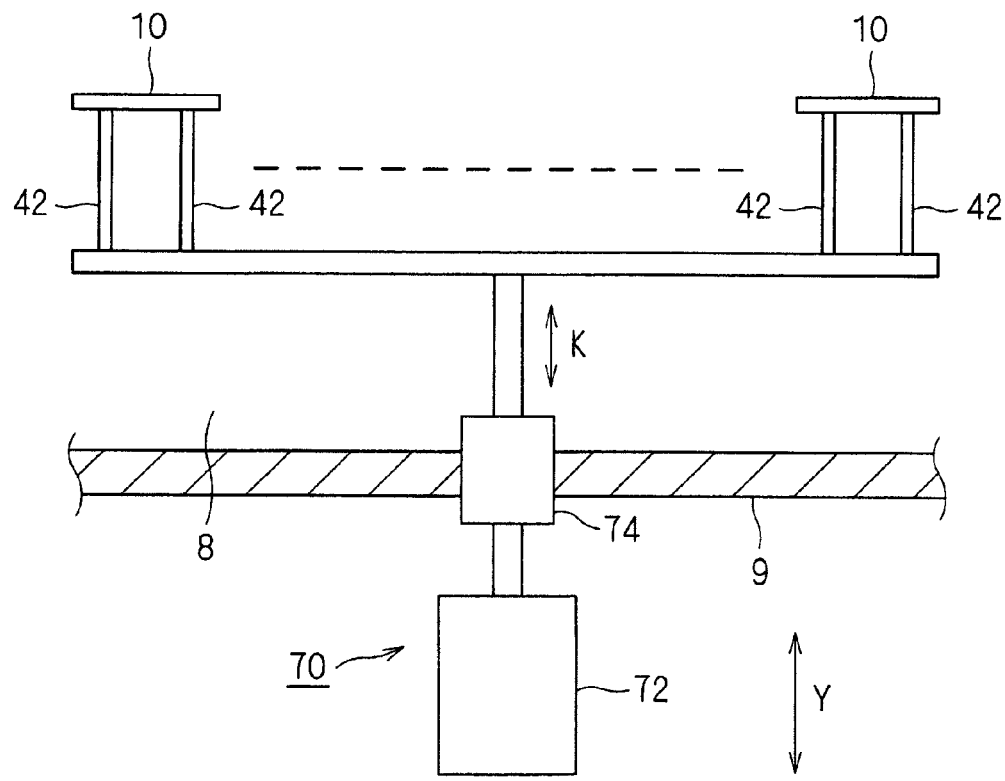
FIG. 8 is a schematic side view showing an example of a lifting pin elevating unit.
Figure 9:
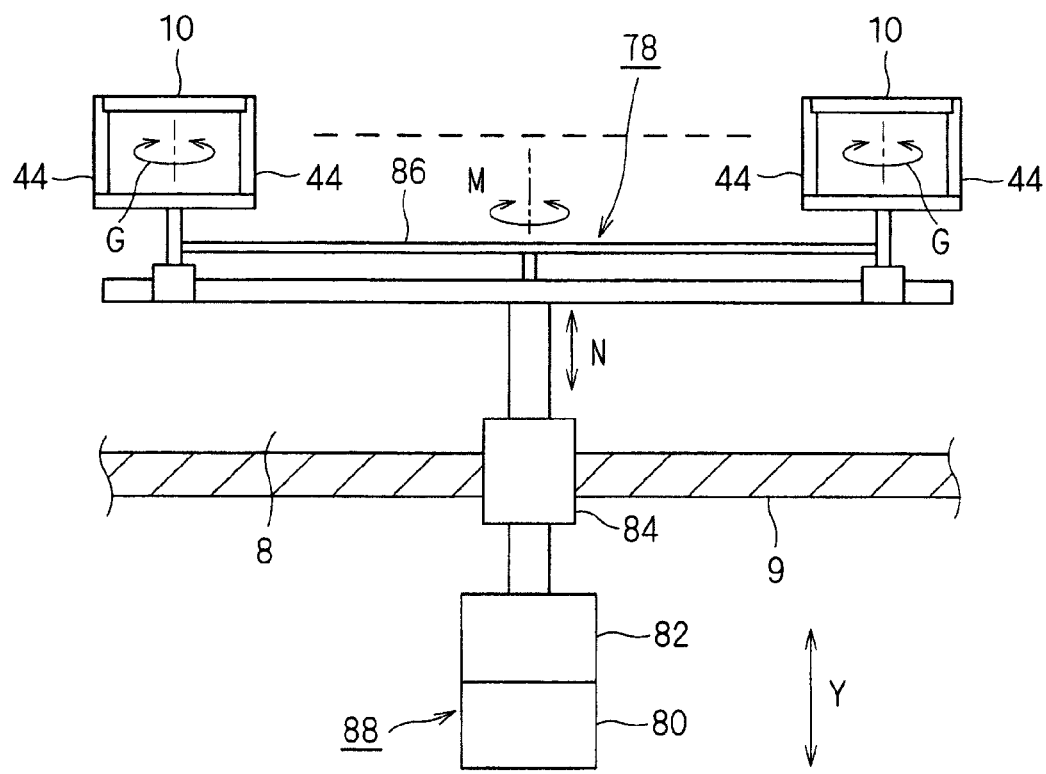
FIG. 9 is a schematic side view showing an example of a twist guide rotating unit and a twist guide elevating unit.
Figure 10:
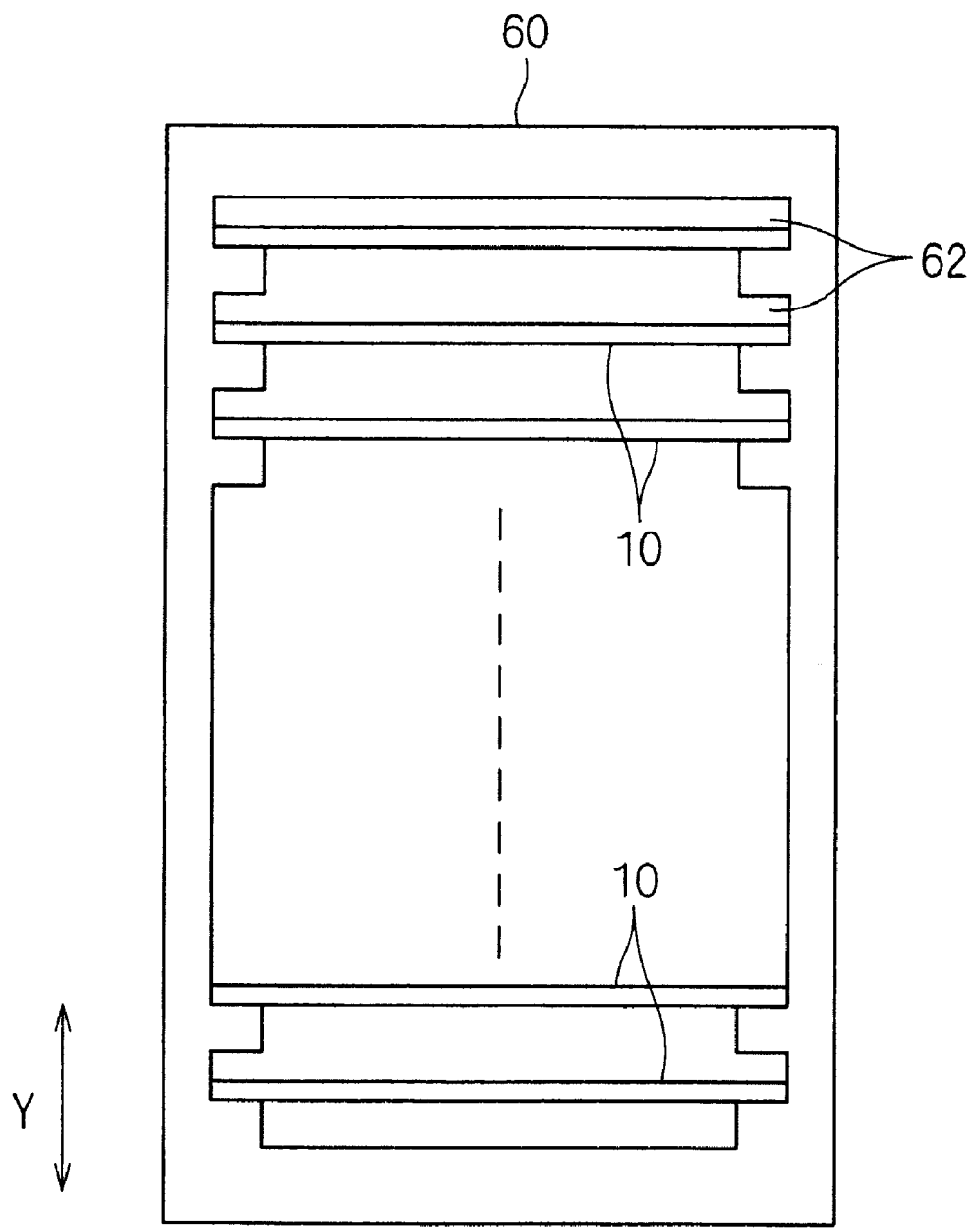
FIG. 10 is a schematic front view showing an example of a substrate containing vessel, when viewed from the substrate carrying unit side.

That is, the intervening unit 40 is equipped with (a) a plurality of lifting pins 42 provided to each substrate 10 respectively to support each substrate 10, (b) the lifting pin elevating unit 70 for elevating collectively the lifting pins 42 (see FIG. 8), (c) a plurality of twist guides 44 provided to each substrate 10 respectively to support corner portions of each substrate 10, (d) a twist guide rotating unit 78 for rotating collectively the twist guides 44 of respective substrates 10 by a predetermined angle around a center 11 of each substrate 10, as indicated with an arrow G (see FIG. 9), and (e) the twist guide elevating unit 88 for elevating collectively the twist guides 44 (see FIG. 9). Then, the intervening unit 40 has a function of intervening the transfer of the substrate 10 between the holder 12 in the substrate exchange position 48 and the first to fourth arms 32a to 32d, and a function of setting collectively a twist angle φ of respective substrates 10 that are to be held by the holder 12 (see also FIG. 4) to a predetermined angle.

The number of the lifting pins 42 per one substrate 10 is set to three, for example. But the number of the lifting pins 42 is not limited to this. The number of the twist guide 44 per one substrate 10 is set to two in a simplified illustration in FIG. 2, FIG. 5, etc. But the number of the twist guides 44 is not limited to this, and three or four twist guides 44 may be employed, for example.

A plurality of electrostatic chucks 14 for attracting and holding the substrate 10 by means of static electricity respectively are fitted to the holder 12. In addition, in this embodiment, a planar shape of each electrostatic chuck 14 is shaped into a rectangle corresponding to the substrate 10, and the electrostatic chuck 14 is fixed to direct in the direction that corresponds to the twist angle φ of the rectangular substrate 10.

In this embodiment, holes through which the lifting pin 42 of each substrate 10 passes are provided in each electrostatic chuck 14 respectively. Respective lifting pins 42 are moved vertically to pass through the holes in the electrostatic chuck 14 on the holder 12 that is kept in the horizontal state.

The twist angle φ of the substrate 10 is one of parameters that represent an arrangement (direction) of the substrate 10 in the ion implanter, and represents the direction of the substrate 10 with respect to the ion beam 4. In the example shown in FIG. 4 and FIG. 5, an angle between a long side of the rectangular substrate 10 and the X-direction is set as the twist angle φ, but this angle is same as an angle between a major axis of the substrate 10 and the X-direction. In this case, another angle may be decided as the twist angle φ. The twist angle φ is set to 23 degree, for example, but is not limited to this.

Respective concrete examples of the lifting pin elevating unit 70, the twist guide rotating unit 78, and the twist guide elevating unit 88 will be explained as follows.

Like an example shown in FIG. 8, for example, the lifting pin elevating unit 70 is constructed such that a plurality of lifting pins 42 positioned in the implantation chamber 8 are moved vertically collectively, as indicated with an arrow K, by a driving source 72 via a vacuum sealing portion 74. This driving source 72 is provided out of the bottom surface 9 of the implantation chamber 8.

Like an example shown in FIG. 9, for example, the twist guide rotating unit 78 is constructed such that a link mechanism 86 provided in the implantation chamber 8 is turned reciprocally, as indicated with an arrow M, by a rotating/driving source 82 via a vacuum sealing portion 84, and then the twist guides 44 for respective substrates 10 coupled to this link mechanism 86 are turned reciprocally, as indicated with the arrow G, respectively. This rotating/driving source 82 is provided out of the bottom surface 9 of the implantation chamber 8.

Like an example shown in FIG. 9, for example, the twist guide elevating unit 88 is constructed such that a plurality of twist guides 44 positioned in the implantation chamber 8 are moved vertically collectively, as indicated with an arrow N, by a driving source 80 via the vacuum sealing portion 84. This driving source 80 is provided out of the bottom surface 9 of the implantation chamber 8. The link mechanism 86 is able to respond to this vertical motion.

The lifting pins 42, the twist guides 44, the lifting pin elevating unit 70, the twist guide rotating unit 78, and the twist guide elevating unit 88 are arranged not to disturb their operations respectively.

By reference to FIG. 2, a beam monitor 68 for receiving the ion beam 4 and measuring a beam current density distribution in the Y-direction is provided in the implantation chamber 8. In this embodiment, this beam monitor 68 has a plurality of beam measuring elements (e.g., Faraday cups. Ditto with the following) aligned over a range that is wider than the dimension $W_Y$ of the ion beam 4 in the Y-direction. In this case, as the beam monitor 68, the structure for moving one beam measuring element in the Y-direction may be employed.

In this embodiment, followings are provided on the atmosphere side out of the implantation chamber 8.

That is, two substrate containing vessels 60 are provided in positions that oppose to the first load lock mechanism 20a, and the first substrate carrying unit 50a is provided between the mechanism 20a and the vessel 60. Also, two substrate containing vessels 60 are provided in positions that oppose to the second load lock mechanism 20b, and the second substrate carrying unit 50b is provided between the mechanism 20b and the vessel 60. A standby unit 66 is provided between both substrate carrying units 50a, 50b.

Each substrate containing vessel 60 is called a hoop. Like an example shown in FIG. 10, for example, the substrate 10 can be contained in plural stages in the vertical direction (Y-direction), and the substrate 10 can be loaded and unloaded by the corresponding substrate carrying unit 50a or 50b (concretely, by the arms 52a to 52d). A portion in which each substrate 10 is contained is called a slot 62.

The standby unit 66 is used to store the substrate 10 once. This standby unit 66 has the similar structure to the substrate containing vessel 60, and can contain the substrate 10 in plural stages in the vertical direction (Y-direction). In this case, the faces of this standby unit 66 opposing to both substrate carrying units 50a, 50b are opened, and the substrate 10 can be loaded and unloaded by both substrate carrying units 50a, 50b.

Both substrate carrying units 50a, 50b have the same structure mutually. Therefore, mainly a concrete example will be explained hereunder by taking the first substrate carrying unit 50a as an example.

By reference to FIG. 2, the first substrate carrying unit 50a has two arms 52a, 52b whose tip portions (hand portions) are positioned vertically mutually. The substrate 10 can be held and carried by the hand portions respectively. In this embodiment, a vacuum chuck 54 for sucking and holding the substrate 10 by vacuum is provided to the hand portions respectively.

The first substrate carrying unit 50a can control expansion and contraction of the arms 52a, 52b independently, and can collectively turn and move vertically both arms 52a, 52b. Further, this first substrate carrying unit 50a can moves reciprocally along the X-direction, as indicated with an arrow S.

According to the above structure, the first substrate carrying unit 50a can execute the load/unload of the substrate 10 into/from two substrate containing vessels 60 located on the preceding side, execute the load/unload of the substrate 10 into/from the first load lock mechanism 20a, and execute the load/unload of the substrate 10 into/from the standby unit 66.

The second substrate carrying unit 50b has also two arms 52c, 52d, and has the same structure as the first substrate carrying unit 50a, as described above. The second substrate carrying unit 50b can execute the load/unload of the substrate 10 into/from two substrate containing vessels 60 located on the preceding side, execute the load/unload of the substrate 10 into/from the second load lock mechanism 20b, and execute the load/unload of the substrate 10 into/from the standby unit 66.

An example of an overall operation of the ion implanter according to this invention will be explained with reference to FIG. 2, FIG. 11 to FIG. 14, and the like hereunder. FIG. 11 to FIG. 14 correspond to FIG. 2. In this case, FIG. 11 to FIG. 14 are schematic views, and illustration of the portions that are not so required for the explanation is omitted herein. The omitted portions will be referred to FIG. 1 to FIG. 10 explained above. Also, details of the operations of the holder 12, the intervening unit 40, the load lock mechanisms 20a, 20b, the substrate carrying units 30a, 30b, 50a, 50b, and the like have already been explained previously and these details should be referred to them if necessary. Therefore, an example of the overall operation of this ion implanter will be explained mainly in the following. Also, insignificant operations that have not so much the influence on the essence of this invention are omitted or simplified in the explanation.

As an example, explanation will be started from the state shown in FIG. 2 herein. At first the main state is explained hereunder. The ion beam 4 is introduced into the implantation chamber 8. The holder 12 is held in a standing state, and six non-implanted substrates 10 are held on the holder 12. Both load lock mechanisms 20a, 20b are set in the atmospheric pressure state, the vacuum valve 28 is opened, and three implanted substrates 10 are held by the load lock mechanisms 20a, 20b respectively. Plural non-implanted substrates 10 are contained in the substrate containing vessel 60 respectively. Plural substrates 10 that are picked up from the substrate containing vessel 60 on the left side are also contained in the standby unit 66.

The holder 12 is driven reciprocally and linearly in the irradiation area of the ion beam 4 along the X-direction by the holder driving unit 16. The number of reciprocal motions depends on a necessary dose (ion implantation amount), and the like. Accordingly, the ion implantation can be performed collectively to six substrates 10.

In addition, the holder 12 and the substrate 10 are driven reciprocally and linearly, as explained above. Therefore, unlike the above case where the rotary disc is employed in the related art, a relative velocity between the substrate 10 and the ion beam 4 in the plane of each substrate 10 becomes even (uniform). As a result, uniformity of an ion implantation amount in the plane of each substrate 10 can be improved.

The first substrate carrying unit 50a takes the action to carry (restore) sequentially the implanted substrate 10 located in the first load lock mechanism 20a into the original substrate containing vessel 60, more concretely, into the original slot 62 in the original substrate containing vessel 60 in this embodiment, between the ion implanting operations. In parallel with this restoring action, the same first substrate carrying unit 50a takes the action to pick up the non-implanted substrates 10 from the corresponding substrate containing vessel 60 one by one and then transfer this substrate 10 to the first load lock mechanism 20a. Two arms 52a, 52b enables the first substrate carrying unit 50a to take these actions.

In parallel with the above action, the second substrate carrying unit 50b takes the action to carry sequentially the implanted substrates 10 being stored in the second load lock mechanism 20b into the standby unit 66 once. In parallel with this action, the same second substrate carrying unit 50b takes the action to pick up the non-implanted substrates 10, which are stored previously in the standby unit 66 by the first substrate carrying unit 50a, one by one and then transfer this substrate 10 to the second load lock mechanism 20b. Two arms 52c, 52d enable the second substrate carrying unit 50b to take these actions.

When the exchange between the implanted substrates 10 and the non-implanted substrates 10 is completed in the load lock mechanisms 20a, 20b, both load lock mechanisms 20a, 20b can be exhausted to vacuum by closing the vacuum valve 28 respectively.

Also, subsequently to the exchange between the implanted substrates 10 and the non-implanted substrates 10 in the first load lock mechanism 20a, the first substrate carrying unit 50a takes the action to return the implanted substrates 10 in the standby unit 66 to the original slot 62 of the original substrate containing vessel 60.

Figure 11:
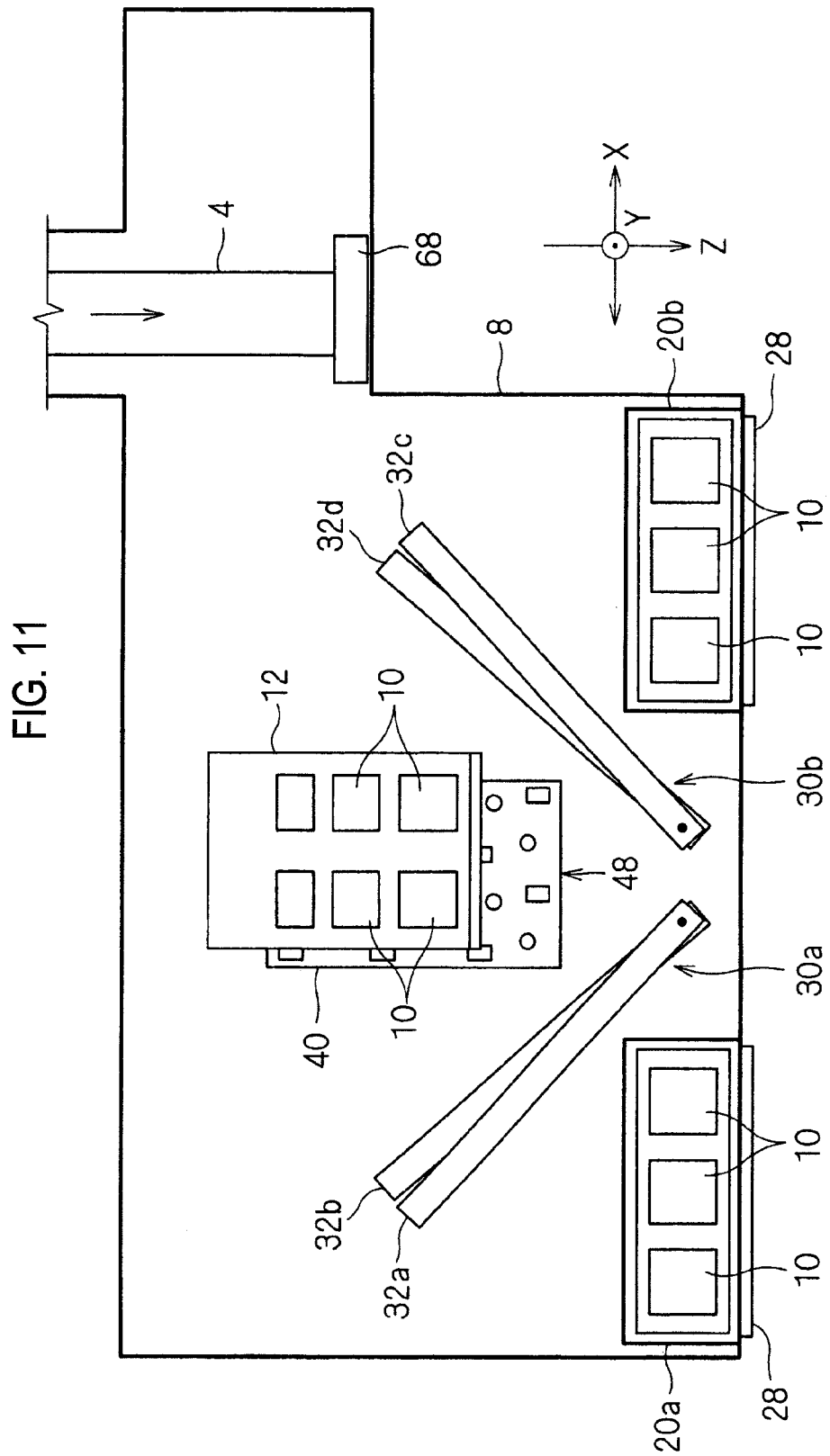
FIG. 11 is a schematic view explaining an example of an overall operation of the ion implanter according to this invention, wherein illustration of the portions that are not so required for the explanation is omitted herein.

After the ion implantation into the substrate 10 held on the holder 12 is completed at a predetermined dose, the holder 12 is restored to the substrate exchange position 48, concretely to the intervening unit 40, and then the holder 12 is kept in a horizontal state. FIG. 11 shows an intermediate state toward the horizontal state. In this case, in the illustration in FIG. 1, the holder 12 is slightly shifted rightward from the intervening unit 40 to facilitate the explanation. Actually the holder 12 is kept in the horizontal state over the intervening unit 40 (see FIG. 12). The first and second substrate carrying units 50a, 50b still continue the carrying operation of the substrate 10 in parallel during the above operations.

Figure 12:
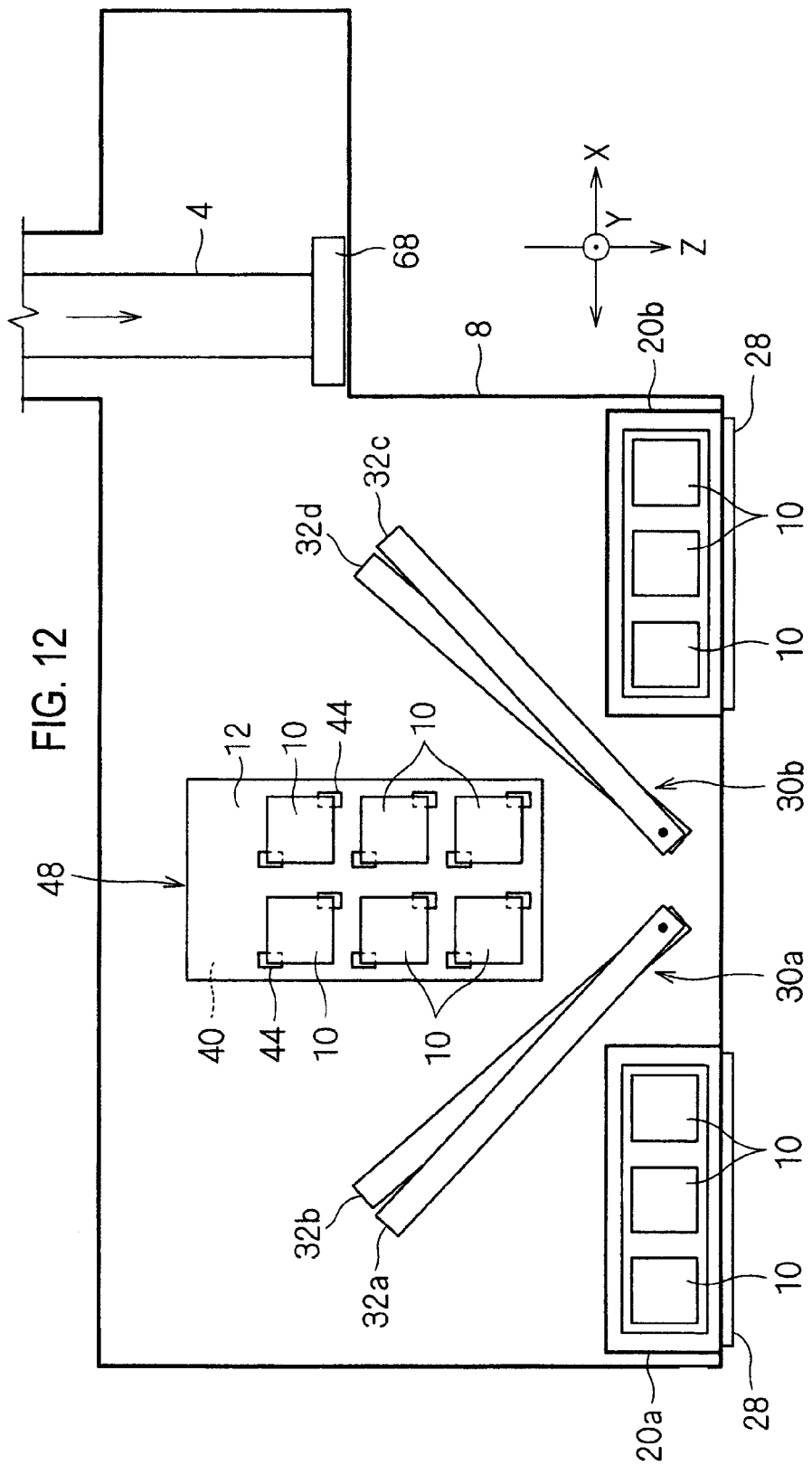
FIG. 12 is another schematic view explaining an example of an overall operation of the ion implanter according to this invention, wherein illustration of the portions that are not so required for the explanation is omitted herein.

Then, as shown in FIG. 12, the twist guides 44 are lifted collectively, and the substrates 10 are received from the holder 12 (more concretely, from the electrostatic chucks 14) by the twist guides 44. In FIG. 12, in order to simplify the illustration, the twist angle φ of the substrate 10 is shown at 0 degree, but an angle other than 0 degree may be employed. Before the twist guides 44 are lifted, respective twist guides 44 are turned to the position corresponding to the twist angle φ of the substrate 10. This is because the twist guides 44 are to be positioned to receive the substrate 10 that is twisted at the twist angle φ.

Figure 13:
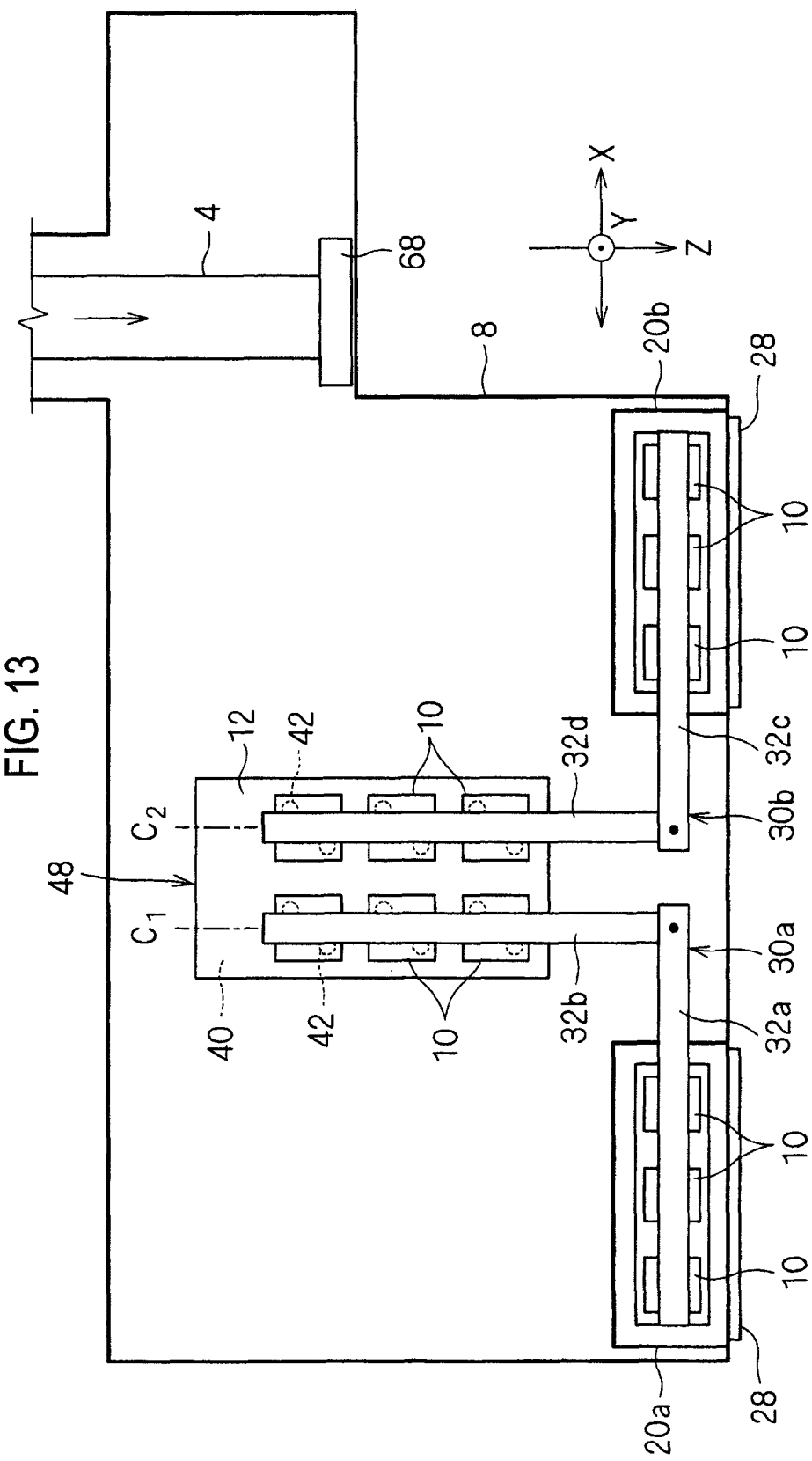
FIG. 13 is still another schematic view explaining an example of an overall operation of the ion implanter according to this invention, wherein illustration of the portions that are not so required for the explanation is omitted herein.

Then, the lifting pins 42 are lifted collectively in a state that the twist angle φ of the substrates 10 held by the lifting pins 42 is restored to 0 degree by turning the twist guides 44, and then respective substrates 10 are received from the lifting pins 42. The reason why the twist angle φ of the substrates 10 is restored to 0 degree is that respective substrates 10 should be transferred to the arm 32b, 32d in that state. As shown in FIG. 13, the second and fourth arms 32b, 32d are positioned over the holder 12 in the above state, and then the implanted substrates 10 are transferred to the arm 32b, 32d by lifting down collectively the twist guides 44 and lifting down collectively the lifting pins 42. In parallel with the above operations, the first and third arms 32a, 32c are positioned over the load lock mechanisms 20a, 20b respectively, and receive the non-implanted substrates 10.

Figure 14:
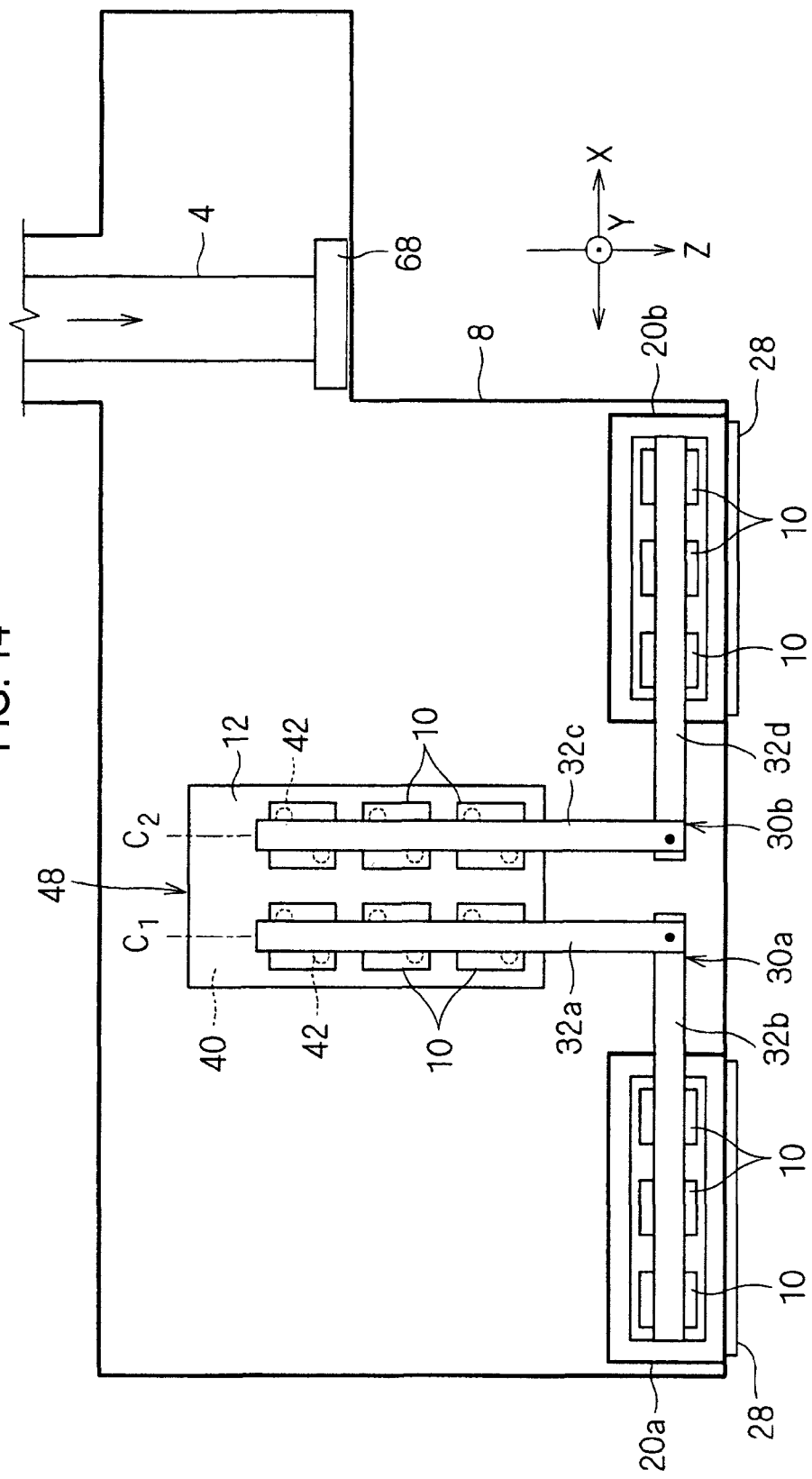
FIG. 14 is yet still another schematic view explaining an example of an overall operation of the ion implanter according to this invention, wherein illustration of the portions that are not so required for the explanation is omitted herein.

Then, as shown in FIG. 14, the positions of the first arm 32a and the second arm 32b are exchanged and the positions of the third arm 32c and the fourth arm 32d are exchanged, the lifting pins 42 are lifted up collectively, and then respective substrates 10 are received from the arms 32a, 32c by the lifting pins 42. At this time, the twist guides 44 are lifted up collectively in the positions that correspond to the twist angle φ of 0 degree. At this time, the twist guides 44 are lifted up to a height that does not interfere with the positions of the arms 32a, 32c. In parallel with the above, the implanted substrates 10 are transferred from the arms 32b, 32d to the load lock mechanisms 20a, 20b.

Then, the empty arms 32a to 32d are restored to the intermediate positions between the intervening unit 40 and the load lock mechanisms 20a, 20b (in the same state as that in FIG. 2). Then, in the intervening unit 40, respective substrates 10 are put on the twist guides 44 by lifting down collectively the lifting pins 42, then the twist angle φ of respective substrates 10 is set collectively to a predetermined angle by turning the twist guides 44 as described above, and then the non-implanted substrates 10 are held on the holder 12 by lifting down collectively the twist guides 44. Concretely, respective substrates 10 are put on the electrostatic chucks 14 and attracted and held by them. Up to now, the action of restoring the implanted substrates 10 by the preceding batch process is completed by the substrate carrying units 50a, 50b.

Then, the holder 12 that are holding the non-implanted substrates 10 is set to the standing state. In parallel with this action, the load lock mechanisms 20a, 20b are ventilated and restored to the atmospheric pressure state, and then the vacuum valve 28 is opened. Then, the ion implanter is returned to the state shown in FIG. 2, and subsequently the similar operations as the above operations are repeated.

Such an example is explained as above that the ion implantation is performed collectively to every six non-implanted substrates 10 that are picked up from the substrate containing vessel 60 on the first substrate carrying unit 50a side and then the implanted substrates 10 are restored in the original substrate containing vessel 60. Similarly, the ion implantation may be performed collectively to every six non-implanted substrates 10 that are picked up from the substrate containing vessel 60 on the second substrate carrying unit 50b side by the similar operations and then the implanted substrates 10 may be restored in the original substrate containing vessel 60.

As described above, according to the ion implanter of this embodiment, the first and second load lock mechanisms 20a, 20b and the first and second substrate carrying units 30a, 30b equipped with two arms respectively are provided. Therefore, the transfer of the substrates 10 between the atmosphere side and the implantation chamber 8 and the carry of the substrates 10 between respective load lock mechanisms 20a, 20b and the holder 12 can be carried out smoothly. As a result, a throughput can be improved.

Also, the holder 12 is constructed such that plural substrates 10 can be held in plural rows formed by the first column $C_1$ and the second column $C_2$ respectively, and also the first and second substrate carrying units 30a, 30b and the first and second load lock mechanisms 20a, 20b are constructed to correspond to such configuration. Therefore, the ion implantation can be performed collectively to the larger number of substrates 10, and plural substrates 10 corresponding to the above plural rows can be handled collectively in the first and second substrate carrying units 30a, 30b and the first and second load lock mechanisms 20a, 20b. As a result, a throughput can be improved.

Also, the intervening unit 40 having a function of intervening the transfer of the substrates 10 between the holder 12 located in the substrate exchange position 48 and the first to fourth arms 32a to 32d and a function of setting collectively the twist angle φ of respective substrates 10, which are to be held by the holder 12, to a predetermined angle is provided. Therefore, the transfer of the substrates 10 between the holder 12 and the first to fourth arms 32a to 32d can be carried out more smoothly. As a result, a throughput can be improved. In addition, the twist angle φ of respective rectangular substrates 10 that are to be held by the holder 12 can be set collectively to a predetermined angle.

Also, as explained previously with reference to FIG. 4 and FIG. 5, the holder 12 has a plurality of electrostatic chucks 14 that have a rectangular planar shape respectively and are fixed toward the direction that corresponds to the twist angle φ of respective substrates 10. Therefore, when the ion implantation is performed while holding respective substrates 10 being twisted by the twist angle φ by using the electrostatic chucks 14, such an event can be prevented that the ion beam 4 hits the electrostatic chucks 14 and the electrostatic chucks 14 are damaged. In addition, since a contact area between the electrostatic chuck 14 and the substrate 10 can be increased, a clamping force for the substrate 10 can be increased and also, since a heat transfer area between the substrate 10 and the electrostatic chuck 14 can be increased, the substrate 10 can be cooled effectively.

Figure 15:
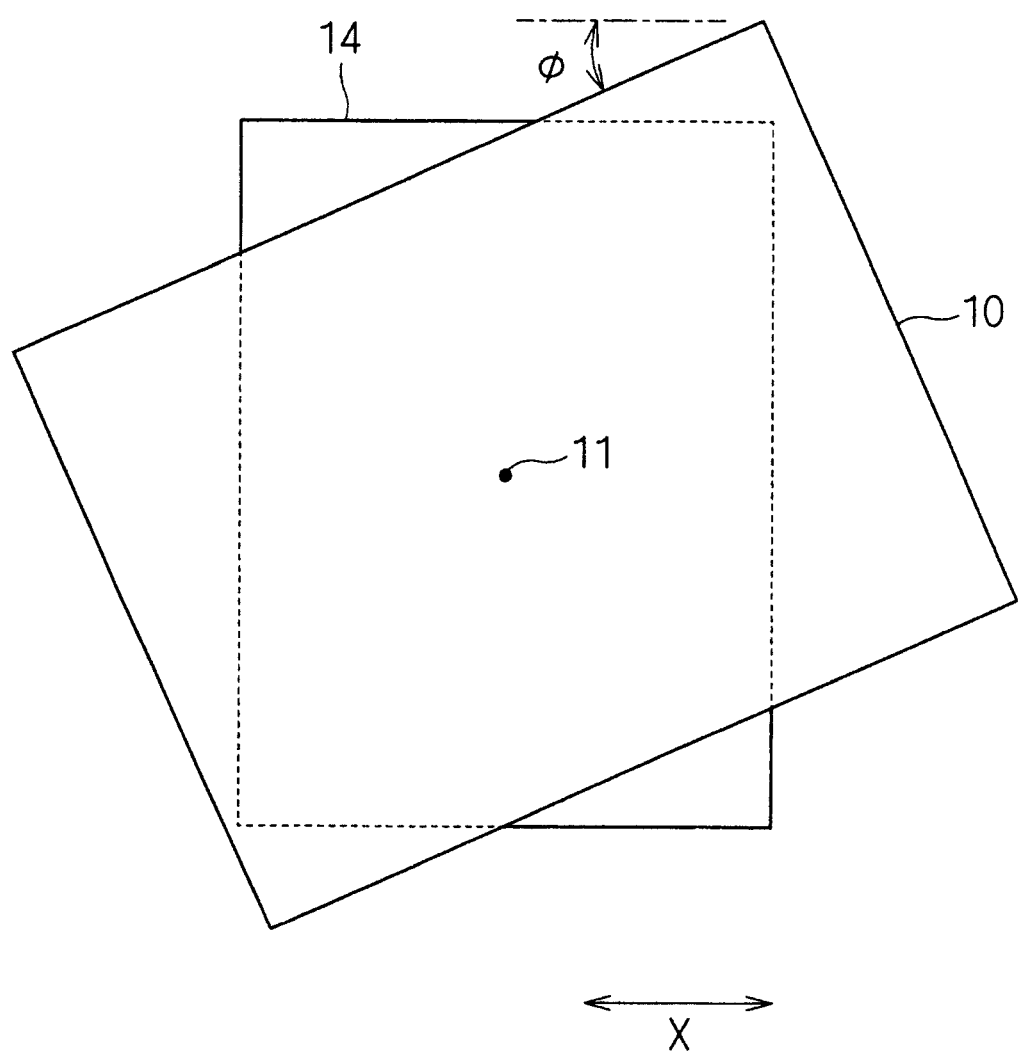
FIG. 15 is a view showing another example of the relation between an electrostatic chuck and the substrate.

Like an example shown in FIG. 15, assume that the electrostatic chuck 14 is fixed to the holder 12 not to correspond to the twist angle φ of the substrate 10. In this case, the surface area of the electrostatic chuck 14 not covered with the substrate 10 is produced, the ion beam 4 hits this surface area (see FIG. 4, for example) during the ion implantation, and it is possible that the electrostatic chuck 14 is damaged by the sputtering, or the like. In order to avoid such situation, when the electrostatic chuck 14 is shaped into a rectangle, a circle, or the like and is covered completely with the substrate 10 by reducing a size, not only a clamping force of the electrostatic chuck 14 is decreased because a contact area between the electrostatic chuck 14 and the substrate 10 is decreased, but also a cooling efficiency of the substrate 10 is lowered because a heat transfer area between the substrate 10 and the electrostatic chuck 14 is decreased.

Figure 16:
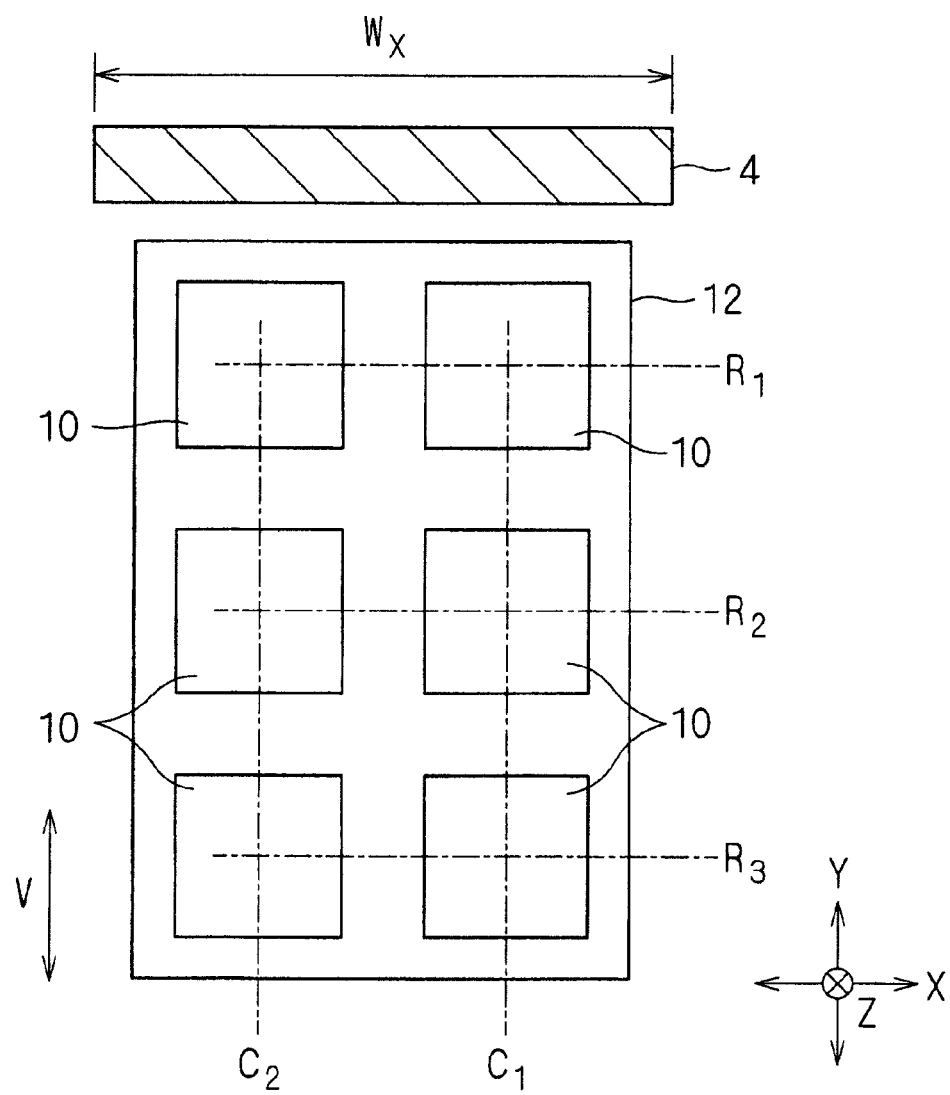
FIG. 16 is a schematic front view showing another example of the relation between the ion beam and an alignment of substrates on the holder, etc.
Figure 17:
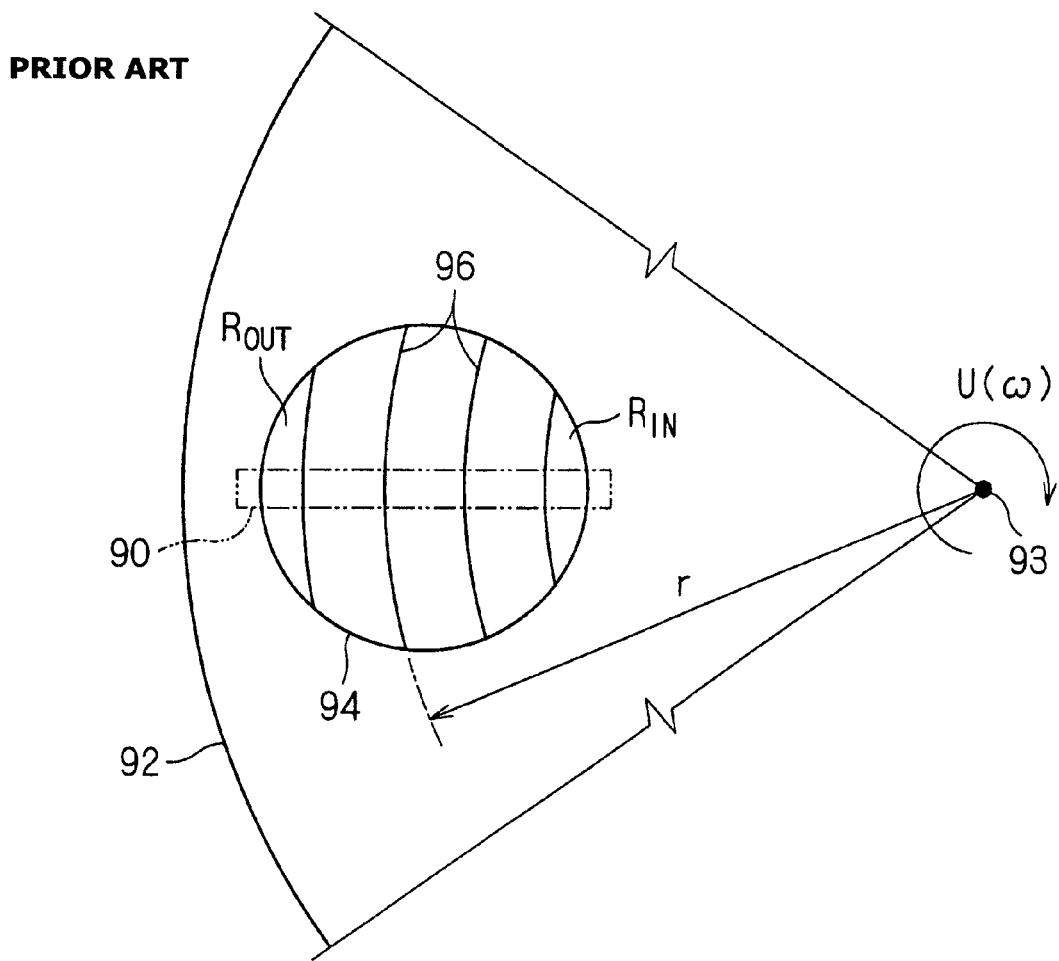
FIG. 17 is a view showing fragmentally a rotary disc of the ion implanter in the related art.

Another example of the relation between the ion beam 4 and an alignment of substrates 10 on the holder 12, etc. is shown in FIG. 16. This figure corresponds to FIG. 4. In FIG. 16, the same reference symbols are affixed to the portions corresponding to those in the example shown in FIG. 2 to FIG. 5, etc. Mainly differences from the concerned example will be explained hereunder.

In the example shown in FIG. 16, in brief the driving direction of the holder 12 and the longitudinal direction of the ion beam 4 are different by 90 degree from the example shown in FIG. 2 to FIG. 5, etc. More specifically, in the case of the example shown in FIG. 16, the holder driving unit equipped with a function of setting the holder 12 in the horizontal state and positioning the holder 12 in the substrate exchange position 48 and a function of setting the holder 12 in standing state and then driving reciprocally and linearly the holder 12 in the irradiating area of the ion beam 4 in the direction that intersects with the X-direction (e.g., the Y-direction), as indicated with an arrow V, is provided.

Also, the ion beam 4 when irradiated onto the substrate 10 has the dimension $W_X$ that covers the substrates 10 being held by the holder 12 on two columns $C_1$, $C_2$ with the scanning of the ion beam or without the scanning.

The constituent conditions other than the driving direction of the holder 12 and the dimension of the ion beam 4 are similar to those in the example shown in FIG. 2 to FIG. 5, etc. Therefore, the intervening unit 40, the substrate carrying units 30a, 30b, the load lock mechanisms 20a, 20b, and the like, which are similar to those in the example shown in FIG. 2 to FIG. 5, etc., may be employed.

In the case of the example shown in FIG. 16, such a configuration is also employed that the holder 12 for holding the substrates 10 on two columns $C_1$, $C_2$ is driven reciprocally and linearly in the irradiation area of the ion beam 4 by the holder driving unit. Therefore, the ion implantation can be performed collectively to plural substrates 10.

In addition, the holder 12 and the substrates 10 are driven reciprocally and linearly, as described above. Therefore, unlike the case where the rotary disc is employed, the relative velocity between the substrate 10 and the ion beam 4 in the plane of each substrate 10 can be made uniform. As a result, the uniformity of the ion implantation amount in the plane of each substrate 10 can be improved.

Further, the advantages similar to those in the example shown in FIG. 2 to FIG. 5, etc. can be achieved.

As the ion source 2, a large ion source having a plurality of filaments in the longitudinal direction (in the case of the example shown in FIG. 2 to FIG. 5, etc., the Y-direction. Ditto with the following) of the ion beam 4 extracted from the ion source may be provided. Then, a beam current density distribution in the longitudinal direction may be measured by using the beam monitor 68 being provided in the implantation chamber 8, and then a controlling unit may control respective filaments of the ion source 2 such that the beam current density distribution in the longitudinal direction of the ion beam 4 being irradiated onto the substrates 10 on the holder 12 can be made uniform.

Accordingly, the ion beam 4 whose dimension in the longitudinal direction is set larger and whose uniformity of the beam current density distribution in the longitudinal direction is improved can be obtained. Therefore, the ion implantation can be performed collectively to the larger number of substrates 10 with good uniformity. As a result, the number of the substrates 10 that are subjected to the batch process can be increased, and thus a throughput can be improved further more.

In the above, explanation is made by taking the case where each substrate 10 has a rectangular shape, as an example. But each substrate 10 may have a circular shape or a quadrangle shape or like that.

In the case where each substrate 10 has a circular shape, a planar shape of each electrostatic chuck 14 may be shaped into a circle.

Also, in the case where each substrate 10 has a circular shape, an aligner (angle fitting unit) for fitting the twist angle of each substrate 10 being held by the holder 12 to a desired angle based on the orientation flat or the notch provided to each substrate 10 may be provided instead of the twist guide rotating unit 78 and the twist guide elevating unit 88. For example, a function of the aligner may be provided to the standby unit 66 shown in FIG. 2. Alternatively, the aligner may be provided instead of the standby unit 66. In both case, the aligner (or the function) capable of fitting the angle of each substrate 10 may be employed. However, the aligner (or the function) capable of fitting the angle of plural substrates 10 arranged in multiple stages in the Y-direction is preferable. This is because such aligner can enhance a throughput.

What is claimed is:

1. An ion implanter, comprising:
   an implantation chamber, which is exhausted to vacuum and into which an ion beam is introduced;
   a holder provided in the implantation chamber, the holder holding substrates, to which an ion implantation is performed by irradiating the ion beam, on two columns of a first column and a second column in an X-direction;
   a holder driving unit, which sets the holder in a horizontal state and then positions the holder in a substrate exchange position, and which sets the holder in a standing state and then drives reciprocally the holder along the X-direction;
   first and second load lock mechanisms, which transfer the substrates between an atmosphere side and the implantation chamber;
   a first substrate carrying unit having a first arm and a second arm that are disposed adjacently, are each substantially straight rods, and are reciprocally rotated independently around a same center line, wherein the first arm carries at least one substrate from the first load lock mechanism to the first column of the holder in the substrate exchange position, and the second arm carries the substrate, carried by the first arm, from the first column of the holder in the substrate exchange position to the first load lock mechanism; and
   a second substrate carrying unit having a third arm and a fourth arm that are disposed adjacently, are each substantially straight rods, and are reciprocally rotated independently around a same center line, wherein the third arm carries at least one substrate from the second load lock mechanism to the second column of the holder in the substrate exchange position and the fourth arm carries the substrate, carried by the third arm, from the second column of the holder in the substrate exchange position to the second load lock mechanism.

2. An ion implanter according to claim 1, wherein the holder holds substrates in plural rows on the first column and the second column respectively,
   the ion beam irradiated onto the substrates has a dimension that traverses plural rows of substrates being held by the holder,
   the first arm and the second arm of the first substrate carrying unit hold plural substrates in positions corresponding to plural rows of the first column of the holder and carry the plural substrates respectively, the third arm and the fourth arm of the second substrate carrying unit hold plural substrates in positions corresponding to plural rows of the second column of the holder and carry the plural substrates respectively, the first load lock mechanism holds plural substrates in positions corresponding to plural substrates that are held by the first or second arm of the first substrate carrying unit, and the second load lock mechanism holds plural substrates in positions corresponding to plural substrates that are held by the third or fourth arm of the second substrate carrying unit.

3. An ion implanter, comprising:

an implantation chamber, which is exhausted to vacuum and into which an ion beam is introduced;

a holder provided in the implantation chamber, the holder holding substrates, to which an ion implantation is performed by irradiating the ion beam, on two columns of a first column and a second column in an X-direction;

a holder driving unit, which sets the holder in a horizontal state and then positions the holder in a substrate exchange position, and which sets the holder in a standing state and then drives reciprocally and linearly the holder in a direction intersecting with the X-direction;

first and second load lock mechanisms, which transfer the substrates between an atmosphere side and the implantation chamber;

a first substrate carrying unit having a first arm and a second arm that are disposed adjacently, are each substantially straight rods, and are reciprocally rotated independently around a same center line, wherein the first arm carries at least one substrate from the first load lock mechanism to the first column of the holder in the substrate exchange position, and the second arm carries the substrate, carried by the first arm, from the first column of the holder in the substrate exchange position to the first load lock mechanism; and a second substrate carrying unit having a third arm and a fourth arm that are disposed adjacently, are each substantially straight rods, and are reciprocally rotated mutually independently around a same center line, wherein the third arm carries at least one substrate from the second load lock mechanism to the second column of the holder in the substrate exchange position and the fourth arm carries the substrate, carried by the third arm, from the second column of the holder in the substrate exchange position to the second load lock mechanism.

4. An ion implanter according to claim 3, wherein the holder holds substrates in plural rows on the first column and the second column respectively, the first arm and the second arm of the first substrate carrying unit hold plural substrates in positions corresponding to plural rows of the first column of the holder and carry the plural substrates respectively, the ion beam irradiated onto the substrates has a dimension that traverses the substrates being held on two columns by the holder, the third arm and the fourth arm of the second substrate carrying unit hold plural substrates in positions corresponding to plural rows of the second column of the holder and carry the plural substrates respectively, the first load lock mechanism holds plural substrates in positions corresponding to plural substrates that are held by the first or second arm of the first substrate carrying unit, and the second load lock mechanism holds plural substrates in positions corresponding to plural substrates that are held by the third or fourth arm of the second substrate carrying unit.

5. An ion implanter according to claim 1, further comprising:

an intervening unit provided in the substrate exchange position, which intervenes a transfer of the substrates between the holder positioned in the substrate exchange position and the first to fourth arms, the intervening unit having a plurality of supporting members provided to each substrate respectively to support each substrate, and an elevating unit elevating collectively the supporting members.

6. An ion implanter according to claim 3, further comprising:

an intervening unit provided in the substrate exchange position, which intervenes a transfer of the substrates between the holder positioned in the substrate exchange position and the first to fourth arms, the intervening unit having a plurality of supporting members provided to each substrate respectively to support each substrate, and an elevating unit elevating collectively the supporting members.

7. An ion implanter according to claim 1, wherein each substrate is a rectangular substrate.

8. An ion implanter according to claim 3, wherein each substrate is a rectangular substrate.

9. An ion implanter according to claim 1, wherein each substrate is a circular substrate.

10. An ion implanter according to claim 3, wherein each substrate is a circular substrate.

11. An ion implanter according to claim 1, wherein each substrate is a rectangular substrate, and wherein the holder comprises a plurality of electrostatic chucks, said ion implanter further comprises:

an intervening unit provided in the substrate exchange position, the intervening unit having a plurality of lifting pins provided to each substrate respectively to support each substrate, a lifting pin elevating unit elevating collectively the lifting pins, a plurality of twist guides provided to each substrate respectively to support corner portions of each substrate, a twist guide rotating unit which rotates collectively the twist guides of respective substrates by a predetermined angle around a center of each substrate for preventing the ion beam from hitting the electrostatic chucks, and a twist guide elevating unit which elevates collectively the twist guides, and wherein the intervening unit intervenes a transfer of the substrate between the holder in the substrate exchange position and the first to fourth arms, and sets collectively a twist angle of respective substrates that are to be held by the holder to a predetermined angle.

12. An ion implanter according to claim 3, wherein each substrate is a rectangular substrate, and wherein the holder comprises a plurality of electrostatic chucks, said ion implanter further comprises:

an intervening unit provided in the substrate exchange position, the intervening unit having a plurality of lifting pins provided to each substrate respectively to support each substrate, a lifting pin elevating unit elevating collectively the lifting pins, a plurality of twist guides provided to each substrate respectively to support corner portions of each substrate, a twist guide rotating unit which rotates collectively the twist guides of respective substrates by a predetermined angle around a center of each substrate for preventing the ion beam from hitting the electrostatic chucks, and a twist guide elevating unit which elevates collectively the twist guides, and wherein the intervening unit intervenes a transfer of the substrate between the holder in the substrate exchange position and the first to fourth arms, and sets collectively a twist angle of respective substrates that are to be held by the holder to a predetermined angle.

13. An ion implanter according to claim 11, wherein each of the plurality of electrostatic chucks clamps and holds respective substrates by means of static electricity, whose planar shape is rectangular and which are fixed to direct in a direction that corresponds to the twist angle of respective substrates.

14. An ion implanter according to claim 12, wherein each of the plurality of electrostatic chucks clamps and holds respective substrates by means of static electricity, whose planar shape is rectangular and which are fixed to direct in a direction that corresponds to the twist angle of respective substrates.

* * * * *